United States Patent
Cheng

(10) Patent No.: US 11,843,389 B1
(45) Date of Patent: Dec. 12, 2023

(54) LOW-POWER, REDUCED-AREA VCO DESIGN WITH POWER SUPPLY NOISE REJECTION

(71) Applicant: Ambarella International LP, Santa Clara, CA (US)

(72) Inventor: Yueh Chun Cheng, Cupertino, CA (US)

(73) Assignee: Ambarella International LP, Santa Clara, CO (US)

( * ) Notice: Subject to any disclaimer, the term of this patent is extended or adjusted under 35 U.S.C. 154(b) by 0 days.

(21) Appl. No.: 17/892,533

(22) Filed: Aug. 22, 2022

(51) Int. Cl.
*H03L 7/099* (2006.01)
*H03L 7/08* (2006.01)
*H03B 5/04* (2006.01)
*H03L 7/089* (2006.01)

(52) U.S. Cl.
CPC .............. *H03L 7/0995* (2013.01); *H03B 5/04* (2013.01); *H03L 7/0802* (2013.01); *H03L 7/0891* (2013.01)

(58) Field of Classification Search
CPC ... H03L 7/0995; H03L 7/0802; H03L 7/0891; H03B 5/04
See application file for complete search history.

(56) References Cited

U.S. PATENT DOCUMENTS

| | | | |
|---|---|---|---|
| 6,222,423 B1* | 4/2001 | Sudjian | H03K 5/133 327/280 |
| 9,455,727 B2* | 9/2016 | Li | H03L 7/093 |
| 2004/0090273 A1* | 5/2004 | Chang | H03L 7/085 331/16 |
| 2010/0090771 A1* | 4/2010 | Shin | H03K 3/0315 331/57 |
| 2012/0256693 A1* | 10/2012 | Raghunathan | H03L 7/099 331/34 |
| 2013/0076450 A1* | 3/2013 | Rao | H03L 7/0896 331/34 |

* cited by examiner

*Primary Examiner* — Jeffrey M Shin
(74) *Attorney, Agent, or Firm* — Christopher P. Maiorana, PC

(57) ABSTRACT

An apparatus comprises a first circuit and a second circuit The first circuit may be configured to generate a control current signal in response to a supply voltage and a first input signal. The first circuit generally provides supply noise rejection to variations in the supply voltage. The second circuit is generally connected to the first circuit and comprises a programmable ring oscillator configured to generate an output signal having a frequency based on the control current signal and a value of a second input signal.

20 Claims, 16 Drawing Sheets

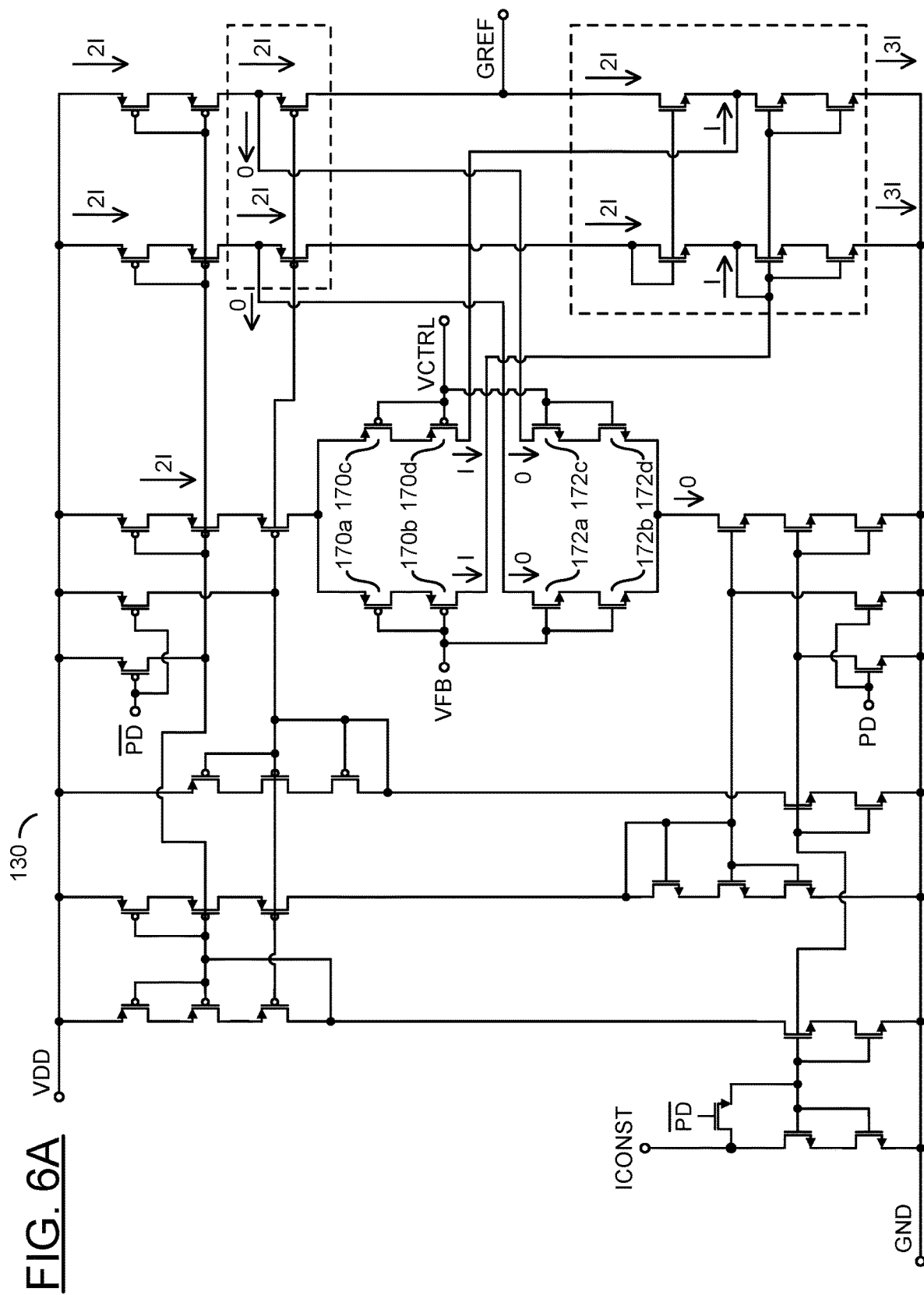

LOW-POWER, REDUCED-AREA VCO DESIGN WITH POWER SUPPLY NOISE REJECTION

FIELD OF THE INVENTION

The invention relates to integrated circuits generally and, more particularly, to a method and/or apparatus for implementing a low-power, reduced-area voltage-controlled oscillator (VCO) design with good power supply noise rejection.

BACKGROUND

Phase-locked loops (PLLs) are important building blocks of communications systems. Phase-locked loops (PLLs) are also used to generate clock signals that control many operations in integrated circuits. In many applications, PLLs are implemented with wide tuning ranges in order to cover desired frequency bands and accommodate variations in process, voltage, and temperature (PVT). For example, an operating frequency of a double data rate (DDR) memory device can range from 4 GHz to 8 GHz.

In order to cover the wide tuning ranges and account for variations due to process, voltage, and temperature (PVT), a voltage-controlled oscillator (VCO) of the PLLs needs a large VCO tuning gain (Kvco) and a large control voltage range. With a large VCO tuning gain (expressed in MHz/V), variations in power supply voltage can result in jitter. A low drop out (LDO) regulator can be used to minimize power supply voltage variations. However, the LDO regulator has disadvantages such as increased cost, because an extra power supply and additional chip area are needed, and increased power consumption, because the extra power supply needs a voltage that is higher than an operating voltage of the VCO.

In addition, operating frequencies of PLLs are increasing and supply voltages are scaling down with advanced complementary metal-oxide-semiconductor (CMOS) technologies (e.g., supply voltage in Samsung 4 nm process is 1.2V). The lower supply voltage and scaled down technologies result in transistors with lower breakdown voltages. Because of the lower breakdown voltages, the LDO regulator needs to remain on when the VCO is in a power down mode to protect the transistors from the higher supply voltage used by the LDO regulator, limiting reduction in static power consumption of the VCO.

It would be desirable to implement a low-power, reduced-area voltage-controlled oscillator (VCO) design with good power supply noise rejection that avoids implementing a LDO regulator.

SUMMARY

The invention concerns an apparatus comprising a first circuit and a second circuit. The first circuit may be configured to generate a control current signal in response to a supply voltage and a first input signal. The first circuit generally provides supply noise rejection to variations in the supply voltage. The second circuit is generally connected to the first circuit and comprises a programmable ring oscillator configured to generate an output signal having a frequency based on the control current signal and a value of a second input signal.

BRIEF DESCRIPTION OF THE FIGURES

Embodiments of the invention will be apparent from the following detailed description and the appended claims and drawings.

FIGS. 6A-6C are diagrams illustrating operation of a wide-swing folded cascade operational transconductance amplifier (OTA) of a control current generating circuit in accordance with an embodiment of the invention.

DETAILED DESCRIPTION OF THE EMBODIMENTS

Embodiments of the present invention include providing a low-power, reduced-area voltage controlled oscillator design with power supply noise rejection that may (i) utilize operational transconductance amplifier feedback, (ii) provide good power supply noise rejection without a low drop out (LDO) regulator, (iii) eliminate LDO static power consumption at power down, (iv) consume half the power of a VCO implementing an LDO regulator, (v) provide reduced cost, (vi) utilize less chip area, (vii) be calibrated to minimize reference spurs and tuning gain to reduce jitter, and/or (viii) be implemented as one or more integrated circuits.

Figure 1:
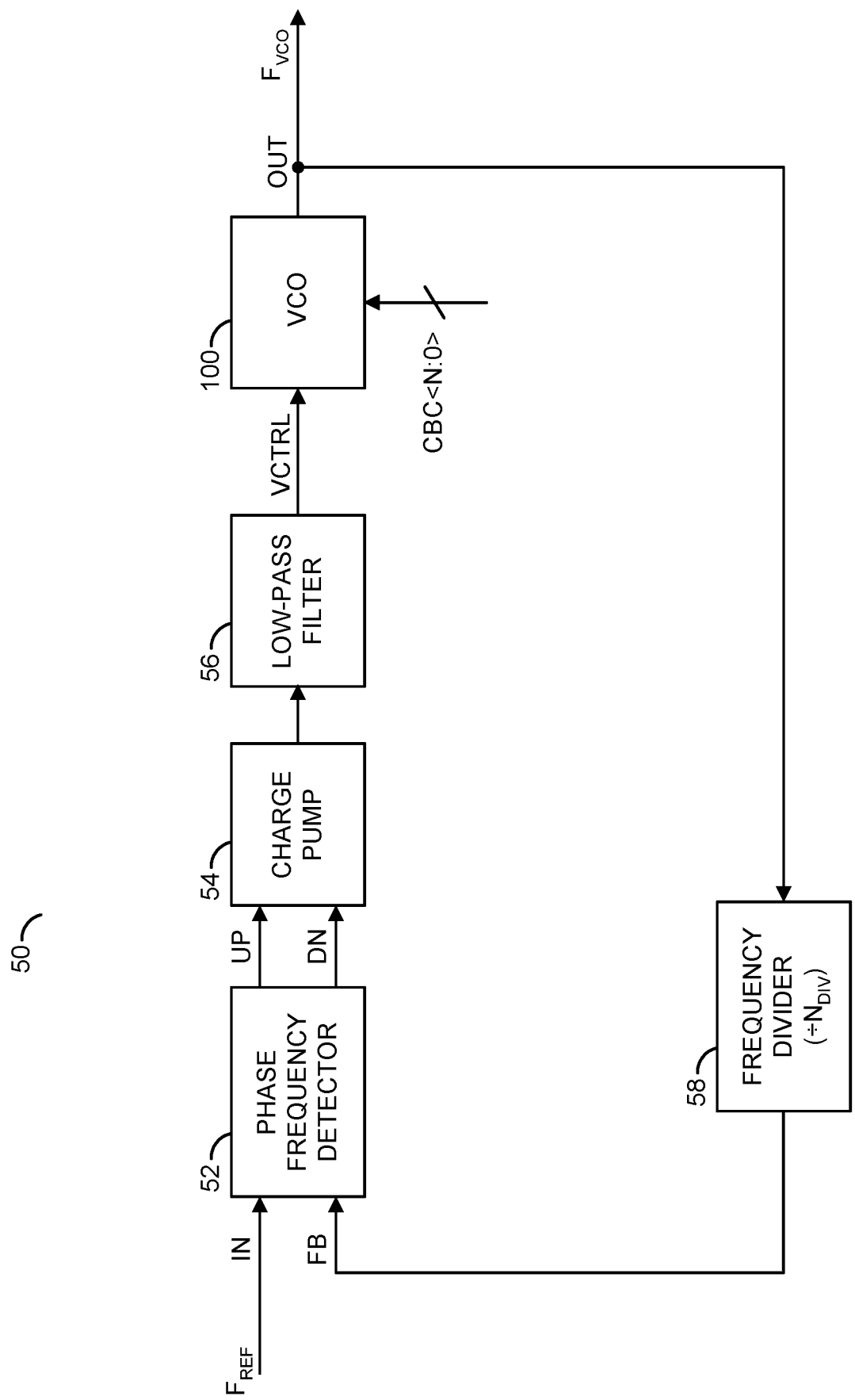
FIG. 1 is a diagram illustrating a phased locked loop circuit in accordance with an embodiment of the invention.

Referring to FIG. 1, a diagram is shown illustrating a phase-locked loop circuit in accordance with an embodiment of the invention. In an example, a circuit 50 may implement a phase-locked loop (PLL) circuit in accordance with an embodiment of the invention. In an example, the circuit 50 may be utilized to implement a frequency synthesizer (or generator) circuit. In an example, the circuit 50 may have an input that may receive an input signal (e.g., IN), and an output that may present an output signal (e.g., OUT). In an example, the input signal IN may comprise a first (or reference) frequency (e.g., $F_{REF}$) and the output signal OUT may comprise a second (or VCO) frequency (e.g., $F_{VCO}$).

In an example, the reference frequency may be derived from a precision frequency source such as a crystal (XTAL) oscillator. In an example, the crystal oscillator may be external to an integrated circuit embodying the circuit 50. In an example, a clock signal from the crystal oscillator may be applied to a pin of the integrated circuit and communicated to the input of the circuit 50. In another example, the clock signal from the crystal oscillator may be presented to an input of a pre-scaler circuit (not shown). The pre-scaler circuit may be configured to divide a frequency of the crystal (or external) oscillator to a desired input frequency $F_{REF}$ of the circuit 50. In an example, the pre-scaler circuit may be programmable to allow operation of the circuit 50 with a variety of source clock frequencies.

In an example, the circuit 50 may be configured to generate the frequency $F_{VCO}$ of the output signal OUT as a multiple (e.g., either integer or fraction) of the frequency $F_{REF}$ of the input signal IN (e.g., $F^{VCO}=N \times F_{REF}$). In various embodiments, the frequency and/or phase of the output signal OUT may be locked to the frequency and/or phase of the input signal IN. In an example, one or more clock signals of the integrated circuit embodying the circuit 50 may be derived from the signal OUT. In an example, the signal OUT may be presented to an input of a post-scaler circuit (not shown). The post-scaler circuit may be configured to generate the one or more clock signals by dividing the frequency $F_{VCO}$ of the signal OUT to obtain respective clock frequencies of the one or more clock signals. In an example, the post-scaler circuit may be programmable to allow operation of the circuit 50 in a variety of applications.

In an example, the circuit 50 may comprise a block (or circuit) 52, a block (or circuit) 54, a block (or circuit) 56, a block (or circuit) 58, and a block (or circuit) 100. In an example, the block 52 may be implemented as a phase frequency detector (PFD) circuit. In another example, the block 52 may be implemented as a phase detector (PD) circuit. The block 54 may be implemented as a charge pump (CP) circuit. The block 56 may be implemented as a loop filter. In an example, the block 56 may be implemented as a low-pass filter. The block 58 may be implemented as a frequency divider. In an example, the block 58 may be implemented as an integer-N architecture divider. In another example, the block 58 may be implemented as a fractional-N architecture divider. In an example, the blocks 52, 54, 56, and 58 may be implemented using conventional techniques.

In various embodiments, the block 100 may be implemented as a voltage-controlled oscillator (VCO). In various embodiments, the block 100 may be implemented as a ring VCO. In various embodiments, the block 100 may be configured to implement a ring VCO utilizing a technique of operational transconductance amplifier (OTA) feedback in accordance with an embodiment of the invention.

In an example, the block 52 is illustrated implementing a phase frequency detector (PFD). The PFD 52 may have a first input that may receive the signal IN, a second input that may receive a signal FB, a first output that may present a signal UP, and a second output that may present a signal DN. The signals UP and DN may implement control signals. The signal FB may be a divided version of the signal OUT. The signal UP, when asserted, may indicate the frequency $F_{VCO}$ of the signal OUT needs to be increased. The signal DN, when asserted, may indicate the frequency $F_{VCO}$ of the signal OUT needs to be decreased. In an example, the PFD 52 may implement an edge sensitive circuit that measures an arrival time of an edge of the signal IN relative to an arrival time of an edge of the signal FB.

In an example, the signal UP may be asserted (e.g., a digital HIGH, or 1) when the edge of the signal IN arrives before the edge of the signal FB. Likewise, the signal DN may be asserted (e.g., a digital HIGH, or 1) when the edge of the signal FB arrives before the edge of the signal IN. In an example, the PFD 52 is generally sensitive to not only a phase difference, but also a frequency difference. When the signal FB is faster than the signal IN (e.g., a frequency $F_{FB}$ of the signal FB is higher than the frequency $F_{REF}$ of the signal IN), edges of the signal FB always arrive earlier than edges of the signal IN, and the signal DN may be asserted to request a decrease in the frequency $F_{VCO}$ of the signal OUT. This functionality generally allows the PFD 52 to function as a frequency detector.

The charge pump 54 is generally driven (controlled) by the PFD 52. In an example, the charge pump 54 may have a first input that may receive the signal UP and a second input that may receive the signal DN. The signals UP and DN may be used to control the charge pump 54 when the charge pump 54 is enabled. In an example, the charge pump 54 may comprise a first current source controlled by the signal UP and a second current source controlled by the signal DN. An output of the charge pump 54 may be coupled to an input of the loop filter 56. In an example, the first current source may be configured to dump charge into an integrating capacitor of the loop filter 56 in response to the signal UP and the second current source may be configured to remove (sink) current from the integrating capacitor of the loop filter 56 in response to the signal DN.

The loop filter 56 may have an output that may present a signal (e.g., VCTRL) comprising a voltage level related to the charge level of the integrating capacitor. If neither the signal UP nor the signal DN is asserted, the output of the charge pump 54 neither dumps charge into nor removes charge from the integrating capacitor of the loop filter 56, which generally happens in steady state. However, any leakage or mismatch between the up/down currents may cause ripples on the output and, therefore, reference spurs to be generated.

In an example, the loop filter 56 may be implemented as a low pass filter. The loop filter 56 is generally configured to reduce ripples on the output of the charge pump 54 and, therefore, reduce reference spurs that may be generated. The loop filter 56 may have an output that may present the signal VCTRL. The signal VCTRL may implement a control voltage signal. In an example (e.g., an operating mode), the loop filter 56 may generate the signal VCTRL in response to the signal received from the charge pump 54. In another example (e.g., a calibration mode), the loop filter 56 may be configured to generate the signal VCTRL in response to a reference voltage signal (e.g., VREF). In an example, the reference voltage VREF may be half of a supply voltage of the PLL 50. In an example, a calibration technique similar to one described in U.S. application Ser. No. 17/683,613, filed Mar. 1, 2022, which is herein incorporated by reference in its entirety, may be utilized.

The block 58 may be implemented as a frequency divider. The block 58 may have an input that may receive the signal OUT and an output that may present the signal FB. In an example, the block 58 may be configured with a divider value (e.g., $N_{DIV}$) corresponding to a desired difference between the frequency $F_{REF}$ of the signal IN and the frequency $F_{VCO}$ of the signal OUT (e.g., $F_{VCO} = F_{REF} * N_{DIV}$). In an example, the block 58 may be programmable to allow operation of the circuit 50 in a variety of applications. In an example, an operating frequency of a double data rate (DDR) memory device may range from 4 GHz to 8 GHz. In an example where the signal IN has a frequency of about 24 MHz, the block 58 may be configured with the divider value $N_{DIV}$ having a range from about 165 to about 334.

The voltage-controlled oscillator (VCO) 100 may have a first input that may receive the signal VCTRL, a second input that may receive a signal (e.g., CBC), and an output that may present the signal OUT. In various embodiments, the signal CBC may be implemented as a multi-bit digital control signal (e.g., CBC<N:0>). In an example, the signal CBC may be implemented as a 7-bit digital control signal (e.g., CBC<6:0>). However, other numbers of bits may be implemented to meet design criteria of a particular implementation. In an example, the number of bits may be selected to ensure a sufficient number of overlapped tuning sub-bands to enable a voltage range of the signal VCTRL to compensate for frequency variation due to temperature variation. In an example, a calibration technique similar to one described in U.S. application Ser. No. 17/683,613, filed Mar. 1, 2022, which is herein incorporated by reference in its entirety, may be utilized to calibrate a value of the signal CBC to minimize reference spurs and VCO tuning gain to reduce jitter. The VCO 100 is generally configured to generate the signal OUT in response to the signal VCTRL, the signal CBC, and a supply voltage VDD. In various embodiments, the supply voltage VDD may be implemented as an analog supply voltage AVDD.

In an example, the PFD 52, the charge pump 54, the loop filter 56, and the VCO 100 are generally implemented in a first power supply domain having an analog supply voltage (e.g., AVDD) and the block 58 may be implemented in a second power supply domain having a digital supply voltage (e.g., DVDD). In various embodiments, the analog supply voltage AVDD and the digital supply voltage DVDD may be different. In an example, the analog supply voltage AVDD may be implemented as 1.2 Volts. In an example, the digital supply voltage DVDD may be implemented as 0.75 Volts. In embodiments where the analog supply voltage AVDD and the digital supply voltage DVDD are different, the PFD 52 may be configured to level shift the signals IN and FB to the level of the analog supply voltage AVDD.

The block 100 may be configured to implement a ring VCO circuit utilizing a technique of operational transconductance amplifier biasing (or feedback) in accordance with an embodiment of the invention. The block 100 is generally configured to generate the signal OUT in response to the signal VCTRL, the signal CBC, and the supply voltage AVDD. In various embodiments, the frequency $F_{VCO}$ of the signal OUT is generally determined in response to the signal VCTRL and the signal CBC. In an example, the block 100 may be configured to select a frequency tuning sub-band that covers a desired operating frequency range in response to the signal CBC. In an example, the signal CBC may be generated using a process similar to one described in U.S. application Ser. No. 17/683,613, filed Mar. 1, 2022, which is herein incorporated by reference in its entirety.

Figure 2:
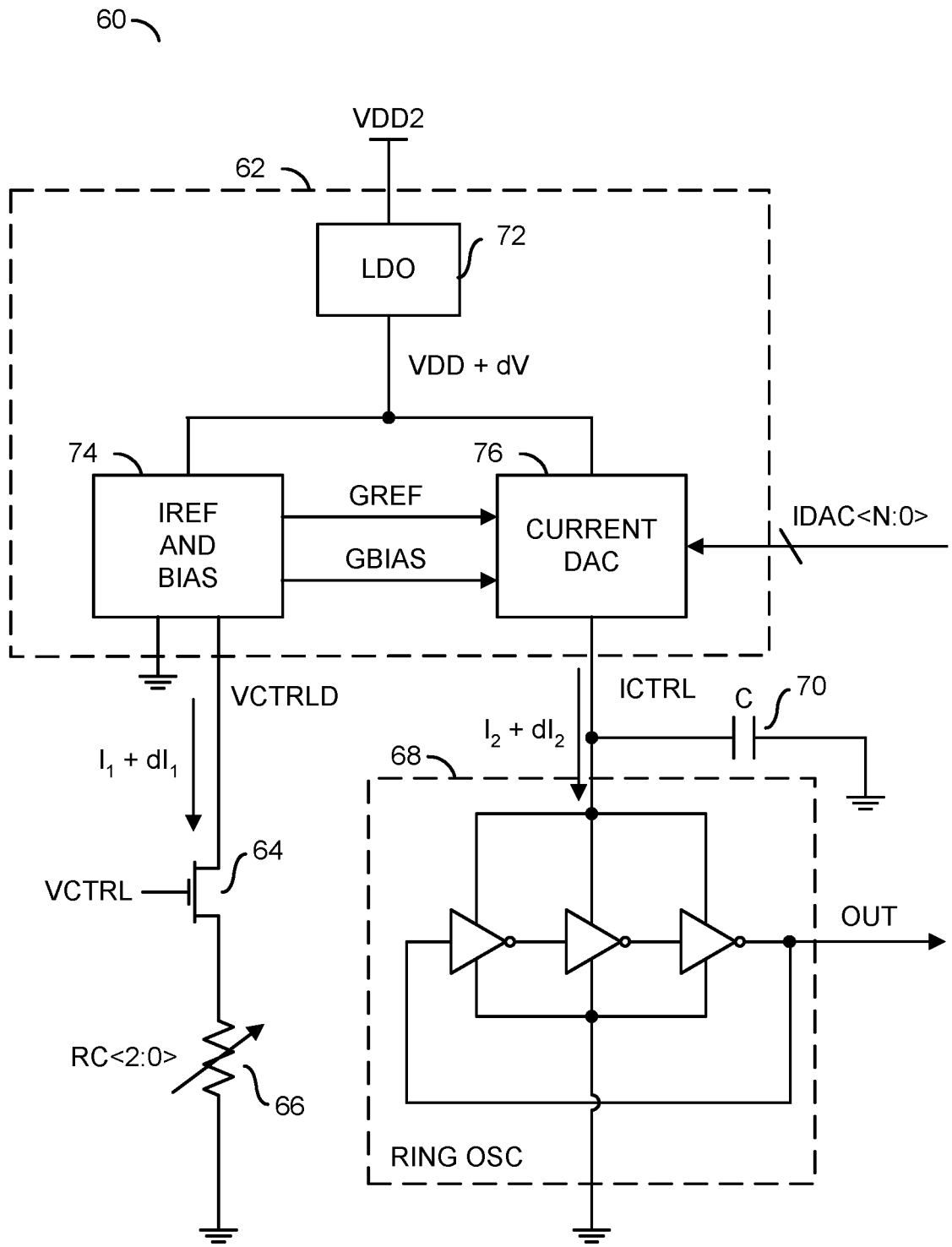
FIG. 2 is a diagram illustrating a current-biased voltage-controlled oscillator circuit with a low drop out regulator for power supply noise rejection.

Referring to FIG. 2, a diagram is shown illustrating a current-biased voltage-controlled oscillator (VCO) 60 implementing a low drop out (LDO) regulator for good power supply rejection. In an example, the current-biased VCO 60 may comprise a circuit 62, a transistor 64, a programmable resistance 66, and a ring oscillator 68. In an example, the circuit 62 may implement a reference current generating circuit. In an example, the transistor 64 may be implemented as an n-channel metal-oxide-semiconductor (NMOS) field effect transistor (FET). In an example, the programmable resistance 66 may be configured to be controlled by a three-bit digital signal (e.g., RC<2:0>). In an example, the ring oscillator 68 may comprise an odd number of inverter circuits connected in a ring. In an example, the ring oscillator 68 may comprise three inverter circuits connected in a ring. A bypass capacitor 70 may be connected between a current control terminal of the ring oscillator 68 and a circuit ground potential. The bypass capacitor 70 generally helps reduce noise on a control current signal (e.g., ICTRL) presented to the current control terminal of the ring oscillator 68.

The circuit 62 may comprise a block (or circuit) 72, a block (or circuit) 74, and a block (or circuit) 76. The block 72 may be implemented as a regulator circuit. In an example, the block 72 may be implemented as a low drop out (LDO) regulator. The block 74 may be implemented as a reference current and bias signal generating circuit. The block 76 may be implemented as a digitally programmable current source. In an example, the circuit 76 may be implemented as an n-bit current-steering digital-to-analog converter. In an example, the circuit 76 may be implemented as a 7-bit current-steering digital-to-analog converter. In an example, the circuit 62 may be implemented similarly to a circuit described in U.S. application Ser. No. 17/683,613, filed Mar. 1, 2022, which is herein incorporated by reference in its entirety.

In an example, a voltage supply VDD2 may be connected to an input of the LDO regulator circuit 72. An output of the LDO regulator circuit 72 may present a regulated supply voltage VDD. The LDO regulator circuit 72 is generally configured to generate a regulated supply voltage VDD from the supply voltage VDD2. In various embodiments, the regulated supply voltage VDD has a level similar to the analog supply voltage AVDD. In an example, the supply voltage VDD2 may be implemented as twice the regulated supply voltage VDD (e.g., VDD2=2.4V for VDD=1.2V). The output of the LDO regulator circuit 72 may be connected to a voltage supply input of the circuit 74 and a voltage supply input of the circuit 76.

A first output of the circuit 74 may present a signal (e.g., GREF). A second output of the circuit 74 may present a signal (e.g., GBIAS). A third output of the circuit 74 may be connected to a drain terminal of the transistor 64. A source terminal of the transistor 64 may be connected to a first terminal of the programmable resistance 66. A second terminal of the programmable resistance 66 may be connected to a circuit ground potential. A second supply terminal of the circuit 74 may also be connected to the circuit ground potential. The signal VCTRL may be presented to a gate terminal of the transistor 64. The signals GREF and GBIAS may be generated by the circuit 74 in response to the regulated supply voltage VDD based on the signal VCTRL and the signal RC<2:0>.

The circuit 74 and the circuit 76 are generally connected to form a current mirror. The circuit 76 may have a first input that may receive the signal GREF, a second input that may receive the signal GBIAS, a third input that may receive a signal IDAC, and an output that may present the control current signal ICTRL. The circuit 76 is generally configured to generate the control current signal ICTRL in response to the regulated supply voltage VDD, the signal GREF, the signal GBIAS, and the signal IDAC. In an example, the signal IDAC may be implemented as an n-bit digital control signal (e.g., IDAC<N:0>). In an example embodiment, the signal IDAC may be implemented as a 7-bit digital control signal (e.g., IDAC<6:0>). The circuit 76 is generally configured to generate the control current signal ICTRL comprising a flexible current ratio 1:K, where K is the floating-point value of the n-bit digital control signal IDAC<N:0>, following a control voltage current (e.g., VCTRLD) generated by the circuit 74 and communicated to the circuit 76 by the signal GREF and the signal GBIAS. In an example, the control current signal ICTRL equals K times the control voltage current VCTRLD. In an example, the circuit 76 may be configured to provide a maximum ratio of 3× between the control current signal ICTRL and the control voltage current VCTRLD.

In general, use of the LDO regulator 72 to provide power supply rejection comes at a cost of increased expense, because an extra power supply and additional area are needed, and increased power consumption, because the extra power supply needs a voltage that is higher than an operating voltage of the current-biased VCO 60. There are a number of contributions to the additional area needed. A printed circuit board area is needed to connect the extra power supply to a chip with the VCO 60. The chip needs an additional pin for the extra power supply, and additional chip area is needed for a circuit net to connect the extra power supply pin to the LDO regulator 72. Additional chip area is also needed for large capacitors (e.g., ~10 pF) utilized by the LDO regulator 72 to reject supply noise and reference voltage noise, and for the large size and number of transistors needed to implement the circuit 76. The higher voltage of the extra power supply results in increased power consumption because the power consumed is the product of the supply voltage and current. When the power is on, both the LDO regulator 72 and the VCO circuitry draw current. For VCO reliability, the LDO regulator 72 needs to remain on even when the VCO is powered down (off). Thus, there is increased power consumption regardless of whether the VCO is on or off. For portable (e.g., battery powered) electronic consumer products, it is important to minimize power consumption during operation and during power down. It is also important to avoid needing to charge large capacitors when power is turned on and off.

If the LDO regulator 72 is omitted, a variation (e.g., dV) in the supply voltage VDD may result in frequency change and jitter. In a current-biased VCO implementing the circuit 62, the control current signal ICTRL may have a magnitude $I_2$ and the signal OUT may have a frequency F1 when the supply voltage is VDD. In a current-biased VCO implementing the circuit 62 without the LDO regulator 72, when the supply voltage VDD changes by dV (e.g., VDD becomes VDD+dV), a change (e.g., $dI_1$) in a magnitude $I_1$ of the control voltage current VCTRLD occurs and a change (e.g., $dI_2$) in the magnitude $I_2$ of the control current signal ICTRL occurs. An increase in the magnitude of the control current signal ICTRL (e.g., to $I_2+dI_2$) results in an increase in the frequency of the signal OUT from F1 to F1+dF1. Thus, frequency variation due to supply noise can cause jitter. In addition, the change $dI_2$ in the magnitude $I_2$ of the control current signal ICTRL may not track the change $dI_1$ in the magnitude $I_1$ of the control voltage current VCTRLD because a voltage level of the control current signal ICTRL may not be equal to a voltage level of the control voltage current VCTRLD. In particular, $dI_2$ may be greater than or less than $dI_1$, depending on a difference between the voltage level of the control voltage current VCTRLD and the voltage level of the control current signal ICTRL. In an example, VCO frequency variation may be largest when $|dI_2|$ is largest, and larger than $|3dI_1|$ when the signal IDAC has a value of three. Variations in the currents result in frequency change and jitter.

Figure 3:
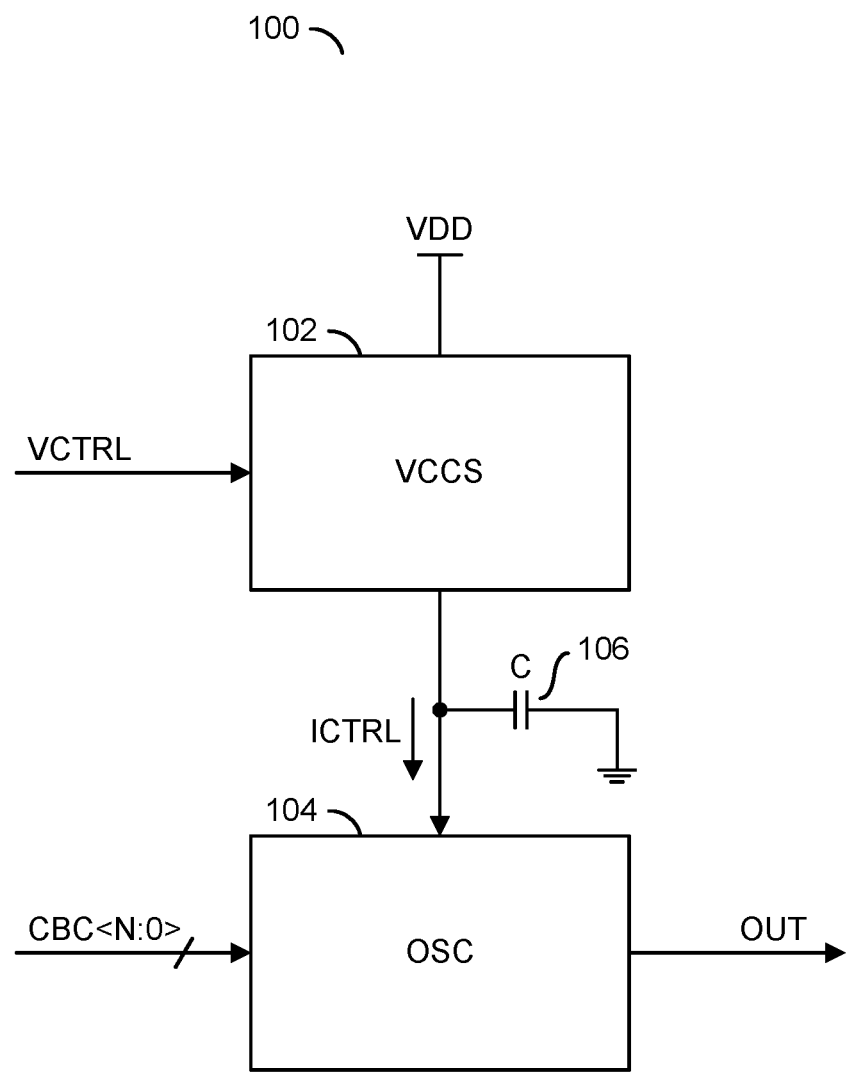
FIG. 3 is a diagram illustrating a voltage-controlled oscillator in accordance with an embodiment of the invention.

Referring to FIG. 3, a diagram is shown illustrating a voltage-controlled oscillator in accordance with an embodiment of the invention. In an example, the VCO 100 may be implemented using an operational transconductance amplifier (OTA) biasing (or feedback) scheme in accordance with an embodiment of the invention. In an example, the VCO 100 may comprise a block (or circuit) 102 and a block (or circuit) 104. The circuit 102 may be implemented as a control current signal generating circuit. The circuit 104 may be implemented as a digitally programmable oscillator circuit. In various embodiments, the circuit 104 may be implemented as an n-bit programmable oscillator circuit. In an example, the circuit 104 may be implemented as a 7-bit programmable oscillator circuit.

In an example, the voltage supply VDD may be coupled to a voltage supply terminal of the circuit 102. An input terminal of the circuit 102 may receive the signal VCTRL. An output of the circuit 102 may present a signal (e.g., ICTRL). In an example, the signal ICTRL may implement a control current signal. In an example, the circuit 102 may be configured to generate the control current signal ICTRL in response to the supply voltage VDD and the signal VCTRL. The circuit 102 generally provides good supply noise rejection to variations in the supply voltage VDD.

The circuit 104 may have a first (current control) input that may receive the control current signal ICTRL, a second (capacitance bank control) input that may receive the signal CBC, and an output that may present the output signal OUT. In an example, a bypass capacitor 106 may be connected between the current control terminal of the circuit 104 and a circuit ground potential. The bypass capacitor 106 generally helps reduce noise on the control current signal ICTRL presented to the current control terminal by the circuit 102. The circuit 104 is generally configured to generate the output signal OUT in response to the control current signal ICTRL and the signal CBC. In various embodiments, the signal CBC may be implemented as an n-bit digital control signal (e.g., CBC<N:0>). In an example embodiment, the signal CBC may be implemented as a 7-bit digital control signal (e.g., CBC<6:0>). In an example, the circuit 104 may comprise a programmable ring oscillator configured to generate the output signal OUT having a frequency (e.g., $F_{VCO}$) based on the control current signal ICTRL and a value of the digital control signal CBC.

Figure 4:
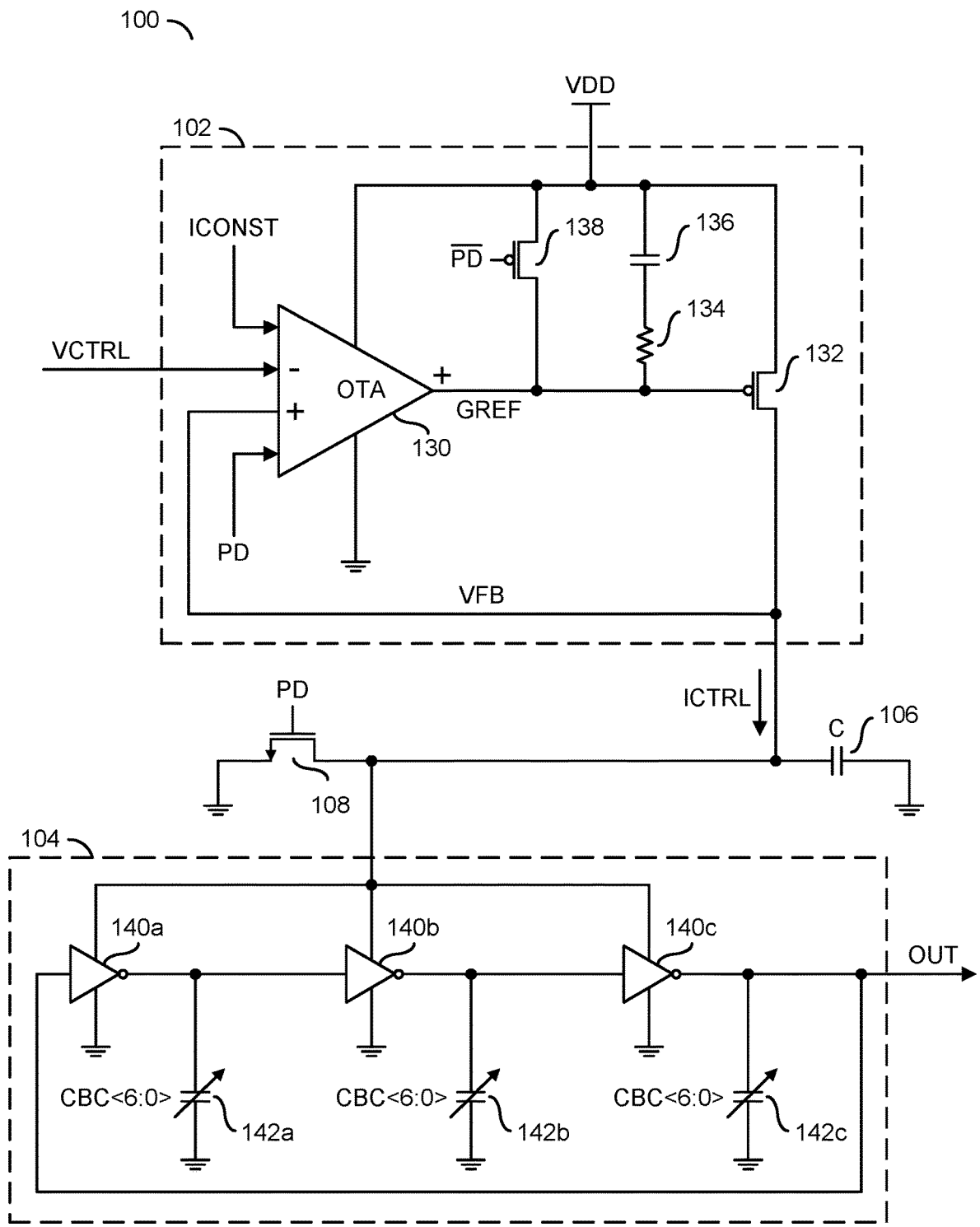
FIG. 4 is a diagram illustrating an example circuit implementation of a voltage-controlled oscillator in accordance with an embodiment of the invention.

Referring to FIG. 4, a diagram is shown illustrating an example circuit implementation of the circuit 100 of FIG. 3. In addition to the bypass capacitor 106 connected between the current control terminal of the circuit 104 and the circuit ground potential, a transistor 108 may be connected between the current control terminal of the circuit 104 and the circuit ground potential. In an example, the transistor 108 may be implemented as an n-channel metal-oxide-semiconductor (NMOS) field effect transistor (FET). A drain terminal of the transistor 108 may be connected to the current control terminal of the circuit 104 and a source terminal of the transistor 108 may be connected to the circuit ground potential. In an example, a signal (e.g., PD) may be presented to a gate terminal of the transistor 108. The signal PD may implement a power down feature.

In an example, the circuit 102 may comprise a block (or circuit) 130, a transistor 132, a resistor 134, a capacitor 136, and a transistor 138. In an example, the circuit 130 may be implemented as an operational transconductance amplifier (OTA). In an example, the circuit 130 may implement a wide-swing folded cascade operational transconductance amplifier. In various embodiments, the OTA 130 may be implemented having an opamp loop bandwidth that is greater than ten times a loop bandwidth of the PLL 50 (e.g., 1 MHz). In an example, the OTA 130 may be implemented having an opamp loop bandwidth greater than 21 MHz over process, voltage, and temperature (PVT). In an example, the transistor 132 and the transistor 138 may be implemented as one or more p-channel metal-oxide-semiconductor (PMOS) field effect transistors (FETs) In an example, the transistor 132 and the transistor 138 may be implemented using 4 nm technology. In an example, the capacitor 136 may be implemented as a metal-oxide-semiconductor (MOS) capacitor.

The circuit 100 generally provides power and area savings when compared to the VCO 60 of FIG. 2. In an example, power consumption in a normal operating mode is a product of the supply voltage VDD and a magnitude of the currents the OTA 130 and the control current signal ICTRL. In a power down mode, the current and, therefore, the power, is zero. The area utilized by the VCO 100, which comprises the areas of the OTA 130, the transistor 132, the resistor 134, the MOS capacitor 136, and the circuit 104, is significantly smaller the area needed by the VCO 60 illustrated in FIG. 2. In an example, the transistor 132 may be implemented having a minimum length (e.g., ~0.07 µm) to save area. The MOS capacitor 136 also utilizes a small area. In contrast, the LDO regulator 72 and the current DAC 76 of a current-biased VCO and the associated bias circuit need a large area as described above in connection with FIG. 2. In an example, stacks of several transistors with transistors having a maximum length (e.g., ~0.2 µm) are needed in the current DAC 76 and the associated bias circuit to reduce current mismatch and improve power supply rejection.

The circuit 130 generally comprises a differential amplifier configured to generate an output current in response to a differential input voltage. In an example, the circuit 130 may provide a voltage controlled current source (VCCS). A first input terminal of the circuit 130 may receive a signal (e.g., ICONST). A second input terminal of the circuit 130 may receive the signal VCTRL. A third input terminal of the circuit 130 may receive a signal (e.g., VFB). A fourth input terminal of the circuit 130 may receive the signal PD. The signal ICONST may implement an input bias current. In an example, the signal ICONST may be generated using bandgap and bias current circuits. In an example, the signal ICONST may comprise a current of approximately 15 µA. However, other current magnitudes may be implemented to meet design criteria of a particular application. The signal VFB may communicate a voltage level produced at the current control terminal of the circuit 104 in response to the control current signal ICTRL. In general, the circuit 130 controls the transistor 132 to adjust the control current signal ICTRL to keep the voltage level of the signal VFB substantially equal to the voltage level VCTRL. By keeping the voltage level of the signal VFB substantially equal to the voltage level VCTRL, the circuit 130 maintains the control current signal ICTRL substantially constant and independent of supply voltage variation. In an example, the circuit 130 may be configured to power down (e.g., have no power consumption) when the signal PD is asserted.

In an example, a first power supply terminal of the circuit 130, a source terminal of the transistor 132, a first terminal of the capacitor 136, and a source terminal of the transistor 138 may be connected to the supply voltage VDD. A second power supply terminal of the circuit 130 may be connected to a circuit ground potential. A drain terminal of the transistor 132 may be connected to the third input of the circuit 130 and an output terminal of the circuit 102. A gate terminal of the transistor 132, a first terminal of the resistor 134, and a drain terminal of the transistor 138 may be connected to an output terminal of the circuit 130. A signal GREF may be presented by the circuit 130 at a node formed by the connection of the output terminal of the circuit 130, the gate terminal of the transistor 132, the first terminal of the resistor 134, and the drain terminal of the transistor 138. A second terminal of the resistor 134 may be connected to a second terminal of the capacitor 136. The signal VFB may be presented at a node formed by the connection of the drain terminal of the transistor 132, a first terminal of the bypass capacitor 106, the drain terminal of the transistor 108, and the current control terminal of the circuit 104.

The resistor 134 and the capacitor 136 are generally configured to provide stability of the output of the OTA 130. The resistor 134 and the capacitor 136 along with the output impedance of the OTA 130 generally provide a first (dominant) pole (e.g. $F_{p1}$) of the OTA 130. A second pole (e.g., $F_{p2}$) of the OTA 130 is generally provided by the capacitor 106 and the impedance looking back from the capacitor 106. The resistor 134, the capacitor 136, and the OTA 130 are generally configured to ensure the first (dominant) pole is low enough for loop stability. The resistor 134 and the capacitor 136 are generally configured to provide a zero (e.g., $F_{zero}$) to compensate the second pole to increase phase margin and bandwidth. The values of the resistor 134 and the capacitor 136 are generally selected such $F_{p1}<F_{p2}<F_{zero}$ In general, the resistor 134 has a value that is orders of magnitude smaller than the output impedance of the OTA 130 (e.g., hundreds of ohms vs. megaohms). In an example, the resistor 134 may be implemented with a value of about 160 ohms and the capacitor 136 may be implemented having a value of about 4.36 pF. Because a MOS capacitor value changes with voltage, the value of the capacitor 136 changes based on the voltage level of the signal GREF. When the voltage level of the signal GREF is lower (e.g., control current signal ICTRL is larger), the value of the capacitor 136 is larger, and $F_{p1}$ and $F_{zero}$ are lower to have increased phase margin. In an example, the inclusion of the resistor 134 and the capacitor 136 may provide a phase margin of greater than about 73 degrees at different values of the control current signal ICTRL and the control voltage VCTRL.

In an example, the transistor 138 may be configured to implement a power down feature where the circuit 102 has zero power consumption when the signal PD is asserted. In an example, a complement of the signal PD may be presented to a gate terminal of the transistor 138 to implement the power down feature. The voltage GREF generally changes with supply variation to keep the drain current $I_d$ of the transistor 132 substantially constant. Thus, the control current signal ICTRL and the voltage level VFB are generally constant and independent of supply voltage variation.

In various embodiments, the circuit 104 may be implemented comprising 2n+1 inverter circuits and 2n+1 digitally-controlled switched-capacitance banks, where n is a positive integer. In an example, the circuit 104 may comprise a plurality of blocks (or circuits) 140a-140c and a plurality of blocks (or circuits) 142a-142c. In an example, the circuits 140a-140c may be implemented as inverter circuits. In an example, the circuits 140a-140c may be implemented as complementary metal-oxide-semiconductor (CMOS) inverters. In an example, the circuits 142a-142c may be implemented as switched-capacitor (or capacitance) banks. In an example, the circuits 142a-142c may be implemented as digitally-programmable, switched-capacitance banks.

A first supply terminal of each of the circuits 140a-140c may receive the control current signal ICTRL. A second supply terminal of each of the circuits 140a-140c may be connected to the circuit ground potential. An output of the circuit 140a may be connected to a first terminal of the circuit 142a and an input terminal of the circuit 140b. An output of the circuit 140b may be connected to a first terminal of the circuit 142b and an input terminal of the circuit 140c. An output of the circuit 140c may be connected to a first terminal of the circuit 142c and an input terminal of the circuit 140a. A second terminal of the circuit 142a, a second terminal of the circuit 142b, and a second terminal of the circuit 142c may be connected to the circuit ground potential. In an example, the signal OUT may be presented at a node formed by the connection of the output of the circuit 140c and the first terminal of the circuit 142c. In some embodiments, the node formed by the connection of the output of the circuit 140c and the first terminal of the circuit 142c may be connected to an input of an AC coupled buffer circuit (not shown) and the signal OUT may be presented at an output of the AC coupled buffer circuit. In an example, the digitally-programmable switched-capacitance banks 142a-142c may be configured to be controlled by the multi-bit digital control signal CBC<6:0>.

Figure 5:
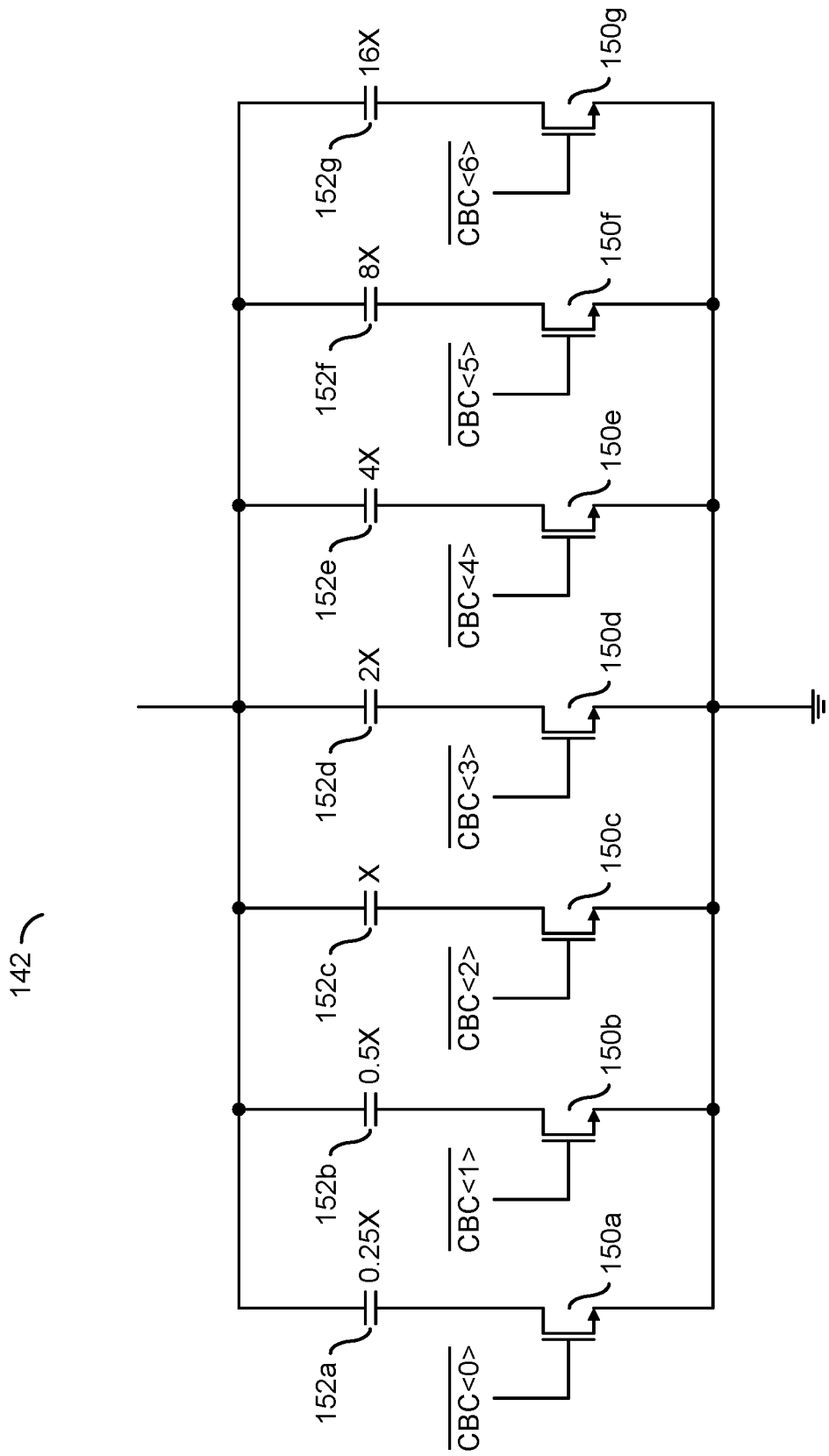
FIG. 5 is a diagram illustrating an example implementation of a digitally-controlled switched-capacitance bank in accordance with an embodiment of the invention.

Referring to FIG. 5, a diagram is shown illustrating an example implementation of a digitally-controlled switched-capacitance bank of FIG. 4. In an example, a circuit 142 may be implemented as an n-bit digitally-controlled switched-capacitance bank. In an example, the circuit 142 may be implemented as a 7-bit digitally-controlled switched-capacitance bank. In an example, the circuit 142 may be used to implement each of the circuits 142a-142c. In an example, the circuit 142 may comprise a plurality of binary-weighted stages. In an example, each of the plurality of binary-weighted stages of the circuit 142 may be controlled by a respective one of the bits of the digital control signal CBC.

In an example implementing seven binary-weighted stages, the circuit 142 may comprise a plurality of transistors 150a-150g and a plurality of capacitors 152a-152g. In an example, the transistors 150a-150g may be implemented as n-channel metal-oxide-semiconductor (NMOS) field effect transistors (FETs). In an example, the capacitors 152a-152g may be implemented as metal-insulator-metal (MIM) capacitors. In another example, the capacitors 152a-152g may be implemented as vertical natural capacitors (VN-CAPs). In an example embodiment where the signal CBC is implemented as a 7-bit signal CBC<6:0>, the capacitance values of the stages of the circuit 142 may be implemented as summarized as in the following Table 1:

TABLE 1

| STAGE CONTROL BIT | CAPACITANCE VALUE |
| --- | --- |
| CBC<0> | 0.25X |
| CBC<1> | 0.5X |
| CBC<2> | X |
| CBC<3> | 2X |
| CBC<4> | 4X |
| CBC<5> | 8X |
| CBC<6> | 16X |

In an example, the capacitance X may be 11.2 fF. However, other capacitance values may be implemented to meet design criteria of a particular implementation.

In an example, a first terminal of the capacitor 152a, a first terminal of the capacitor 152b, a first terminal of the capacitor 152c, a first terminal of the capacitor 152d, a first terminal of the capacitor 152e, a first terminal of the capacitor 152f, and a first terminal of the capacitor 152g may be connected together, forming an input node of the circuit 142. A second terminal of the capacitor 152a may be connected to a drain terminal of the transistor 150a. A second terminal of the capacitor 152b may be connected to a drain terminal of the transistor 150b. A second terminal of the capacitor 152c may be connected to a drain terminal of the transistor 150c. A second terminal of the capacitor 152d may be connected to a drain terminal of the transistor 150d. A second terminal of the capacitor 152e may be connected to a drain terminal of the transistor 150e. A second terminal of the capacitor 152f may be connected to a drain terminal of the transistor 150f. A second terminal of the capacitor 152g may be connected to a drain terminal of the transistor 150g. A source terminal of the transistor 150a, a source terminal of the transistor 150b a source terminal of the transistor 150c, a source terminal of the transistor 150d, a source terminal of the transistor 150e, a source terminal of the transistor 150f, and a source terminal of the transistor 150g may be connected to the circuit ground potential.

In an example, a complement of the signal CBC<0> may be presented to a gate terminal of the transistor 150a, a complement of the signal CBC<1> may be presented to a gate terminal of the transistor 150b, a complement of the signal CBC<2> may be presented to a gate terminal of the transistor 150c, a complement of the signal CBC<3> may be presented to a gate terminal of the transistor 150d, a complement of the signal CBC<4> may be presented to a gate terminal of the transistor 150e, a complement of the signal CBC<5> may be presented to a gate terminal of the transistor 150f, and a complement of the signal CBC<6> may be presented to a gate terminal of the transistor 150g. In some embodiments, the stage comprising the capacitor 152e and the transistor 150e may be implemented as two instances of the capacitor 152d and the transistor 150d connected in parallel, the stage comprising the capacitor 152f and the transistor 150f may be implemented as four instances of the capacitor 152d and the transistor 150d connected in parallel, and the stage comprising the capacitor 152g and the transistor 150g may be implemented as eight instances of the capacitor 152d and the transistor 150d connected in parallel.

Figure 6B:
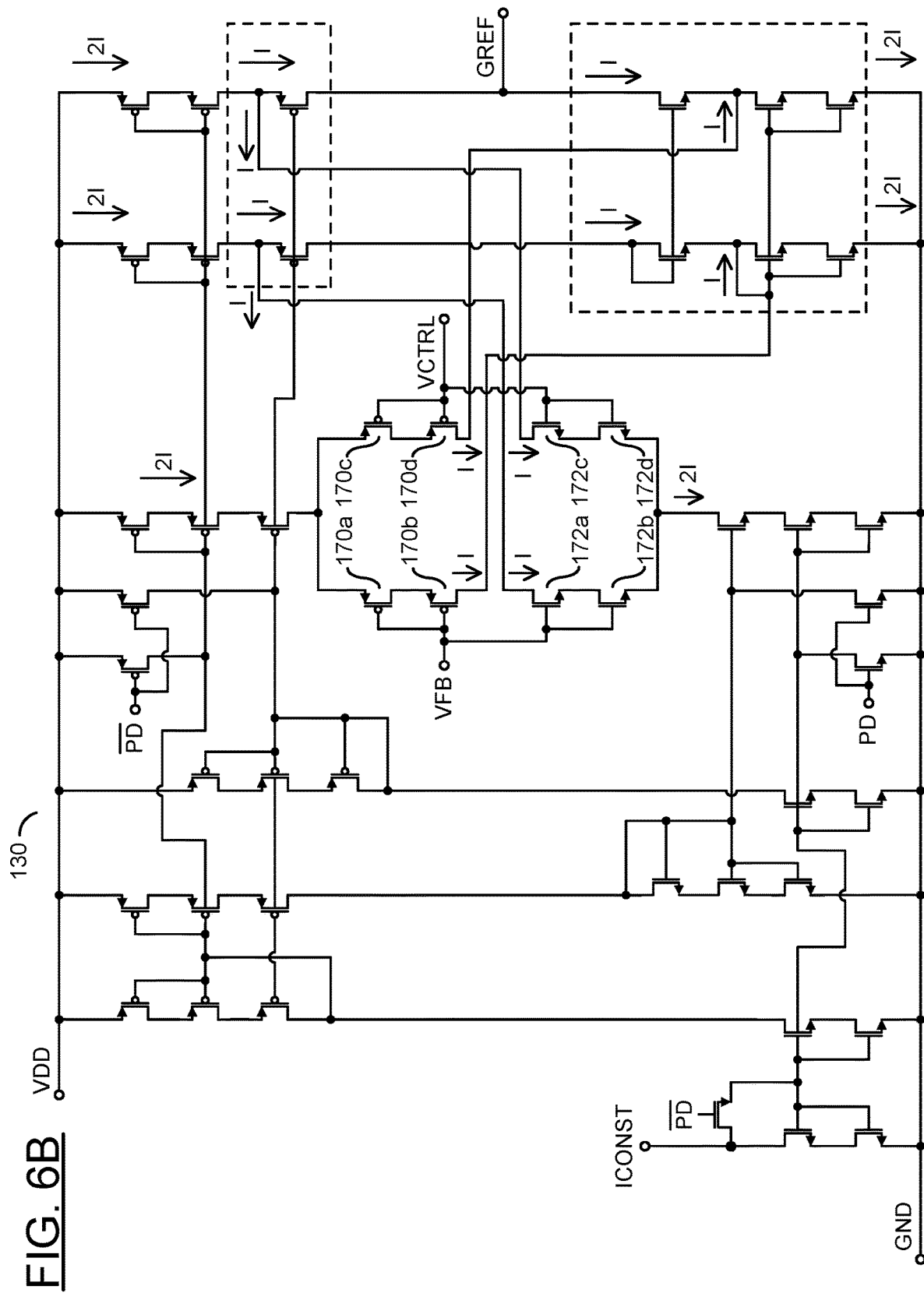
Figure 6C:
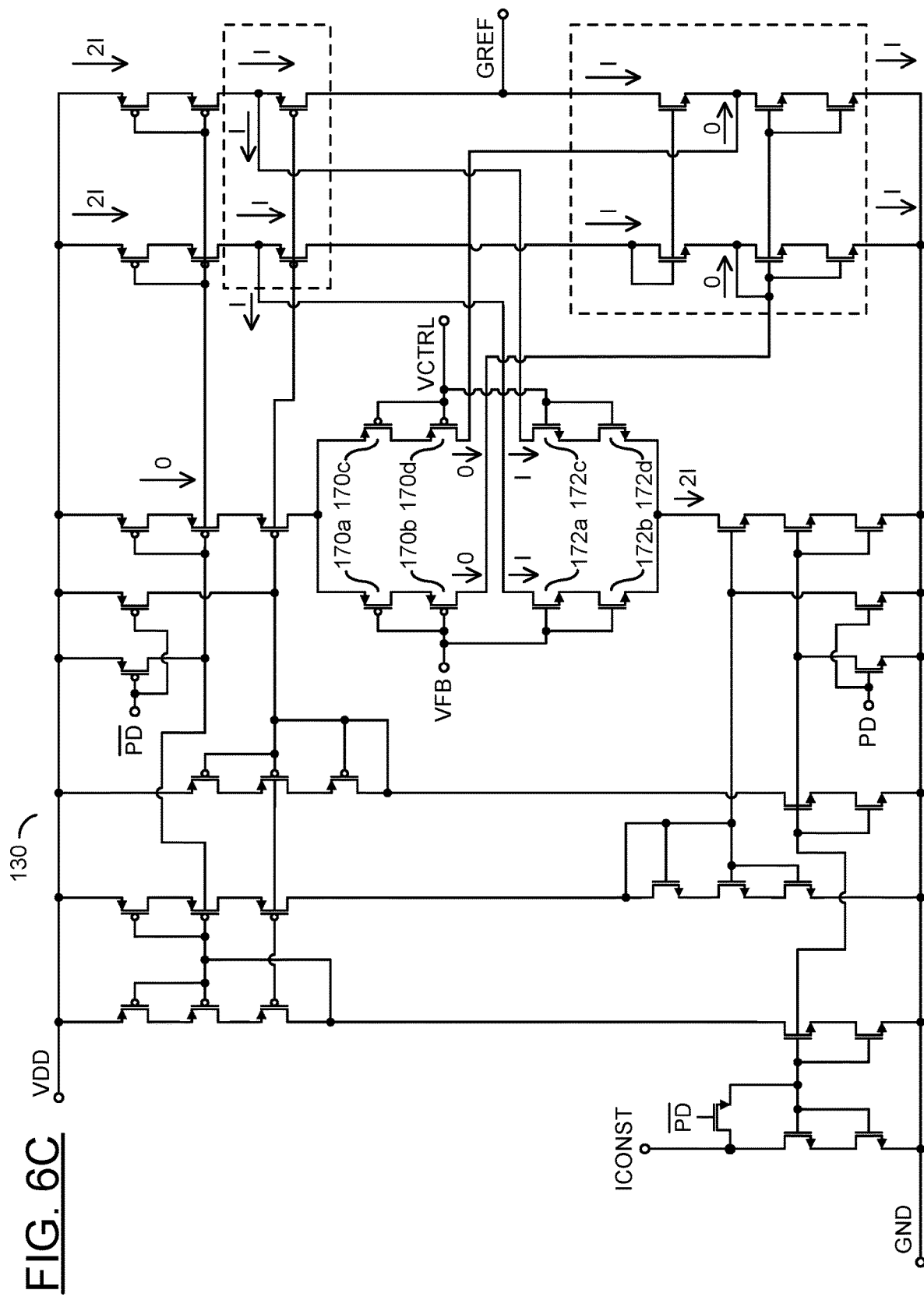

Referring to FIGS. 6A-6C, diagrams of a wide-swing folded cascade operational transconductance amplifier are shown illustrating operation of the circuit 130 in accordance with an embodiment of the invention for various control voltages VCTRL. Bulk terminal connections have been omitted for clarity. Referring to FIG. 6A, a diagram is shown illustrating operation of the operational transconductance amplifier circuit 130 when the control voltage VCTRL is significantly lower than about half of the supply voltage VDD. In an example, an input stage of the operational transconductance amplifier circuit 130 may comprise a plurality of differential PMOS transistors 170a-170d and a plurality of differential NMOS transistors 172a-172d. In an example, only the input differential PMOS transistors 170a-170d of the operational transconductance amplifier 130 are ON (conducting) when the control voltage VCTRL is significantly lower than about half of the supply voltage VDD. Referring to FIG. 6B, a diagram is shown illustrating operation of the operational transconductance amplifier circuit 130 when the control voltage VCTRL is approximately equal to half of the supply voltage VDD. In an example, both the input differential PMOS transistors 170a-170d and the input differential NMOS transistors 172a-172d of the operational transconductance amplifier 130 are ON (conducting) when the control voltage VCTRL is approximately equal to half of the supply voltage VDD. Referring to FIG. 6C, a diagram is shown illustrating operation of the operational transconductance amplifier circuit 130 when the control voltage VCTRL is significantly higher than about half of the supply voltage VDD. In an example, only the input differential NMOS transistors 172a-172d of the operational transconductance amplifier 130 are ON (conducting) when the control voltage VCTRL is significantly higher than about half of the supply voltage VDD.

Figure 7:
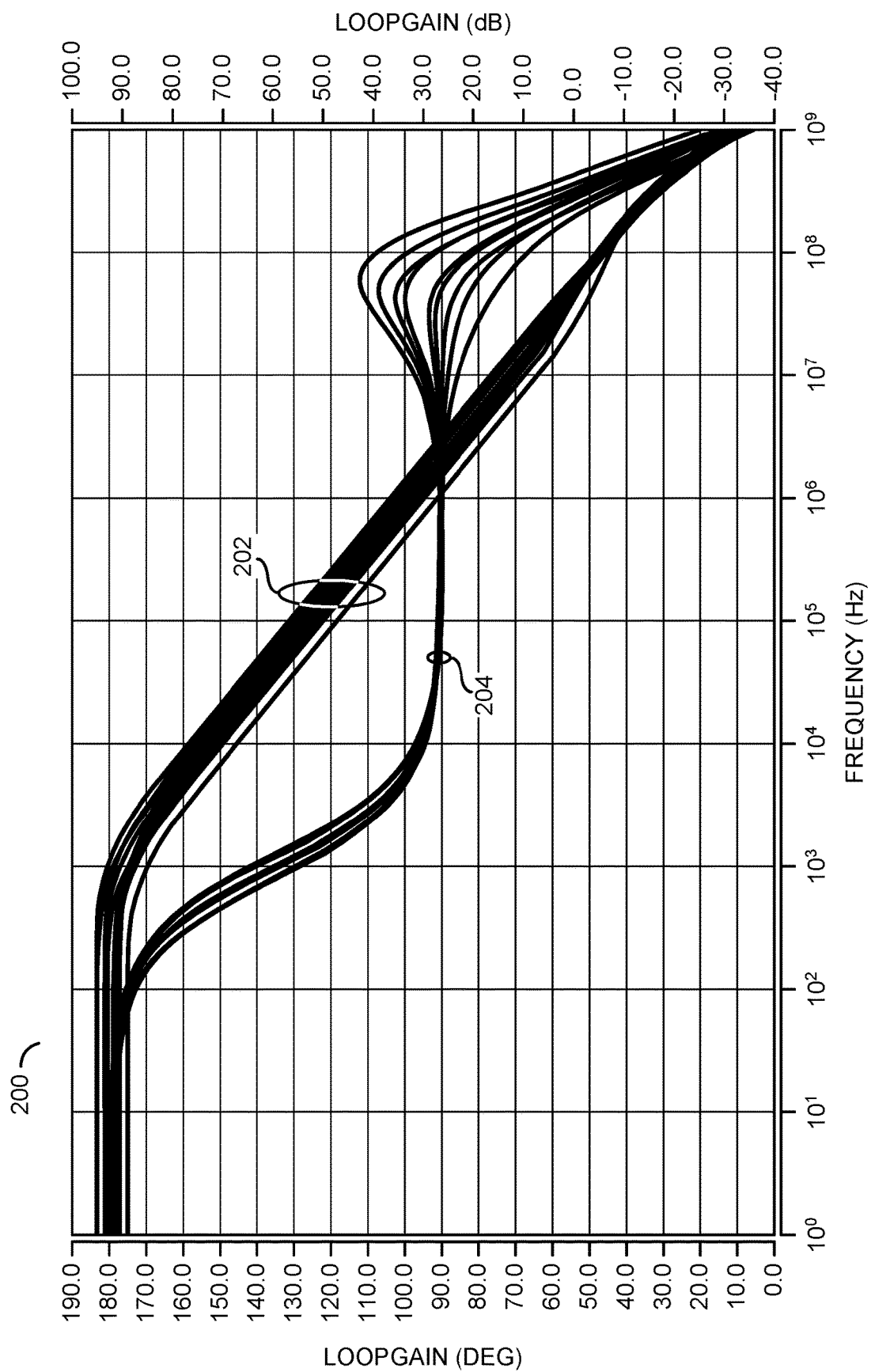
FIG. 7 is a diagram illustrating simulation results for OTA stability of a voltage-controlled oscillator in accordance with an embodiment of the invention at different control voltage and control current levels.

Referring to FIG. 7, a diagram of a graph 200 is shown illustrating simulation results for wide-swing folded cascode OTA stability of a voltage-controlled oscillator in accordance with an embodiment of the invention with values of the control voltage VCTRL of about 0.45 Volt, 0.625 Volt, and 0.8 Volt and values of the control current ICTRL of about 1.4 mA, 2 mA, and 3.5 mA. In an example, sets of curves are presented for permutations of values of the control voltage VCTRL of about 0.45 Volt, 0.625 Volt, and 0.8 Volt and values of the control current signal ICTRL of about 1.4 mA, 2 mA, and 3.5 mA, as summarized in the following Table 2:

TABLE 2

| VCTRL (V) | ICTRL (mA) |
|---|---|
| 0.45 | 1.4 |
| 0.45 | 2 |
| 0.45 | 3.5 |
| 0.625 | 1.4 |
| 0.625 | 2 |
| 0.625 | 3.5 |
| 0.8 | 1.4 |
| 0.8 | 2 |
| 0.8 | 3.5 |

A set of nine curves 202 illustrates loop gain in decibels vs. frequency. A set of nine curves 204 illustrates loop gain in degrees vs. frequency. In an example, when the control voltage VCTRL is in a range of about 0.45 Volt to 0.8 Volts with a control current in a range of about 1.4 mA to 3.5 mA, the voltage-controlled oscillator in accordance with an embodiment of the invention generally has a phase margin greater than 73 degrees and a bandwidth greater than 26 MHz.

Figure 8:
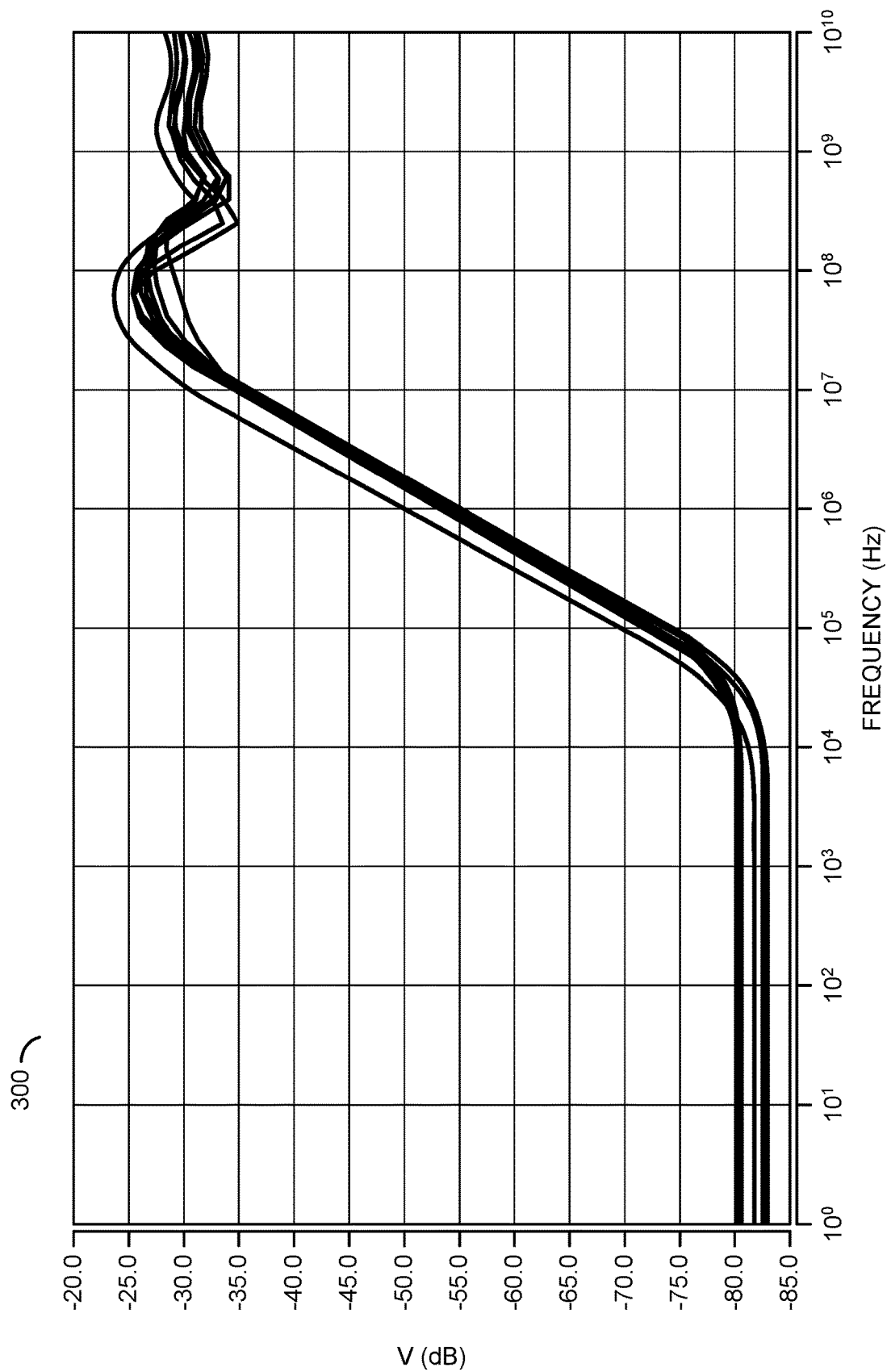
FIG. 8 is a diagram illustrating simulation results for power supply noise rejection of a voltage-controlled oscillator with OTA feedback in accordance with an embodiment of the invention at different control voltage levels.

Referring to FIG. 8, a diagram of a graph 300 is shown illustrating a comparison of AC simulations for supply noise rejection of a voltage-controlled oscillator with OTA feedback in accordance with an embodiment of the invention. The AC simulations illustrate power supply rejection at the current control terminal of the circuit 104 where the control current signal ICTRL is presented. In an example, nine curves are presented for permutations of values of the control voltage VCTRL of about 0.45 Volt, 0.625 Volt, and 0.8 Volt and values of the control current signal ICTRL of about 1.4 mA, 2 mA, and 3.5 mA, as summarized in Table 2 above.

In the graph 300, simulations are shown where the circuit 104 is replaced by resistances emulating the permutations of the voltages of about 0.45 Volt, 0.625 Volt, and 0.8 Volt and the values of the control current signal ICTRL of about 1.4 mA, 2 mA, and 3.5 mA for the current control terminal of the circuit 104 ranging from 4 GHz up to 8 GHz and with AC noise of about 1V applied on the supply voltage VDD. The set of curves generally illustrates supply noise rejection for a voltage-controlled oscillator with OTA feedback in accordance with an embodiment of the invention. In an example, with the VCO in accordance with an embodiment of the invention, a power supply rejection of <−23 dB may be achieved, reducing supply noise to $\frac{1}{10}$ of supply variation.

Figure 9:
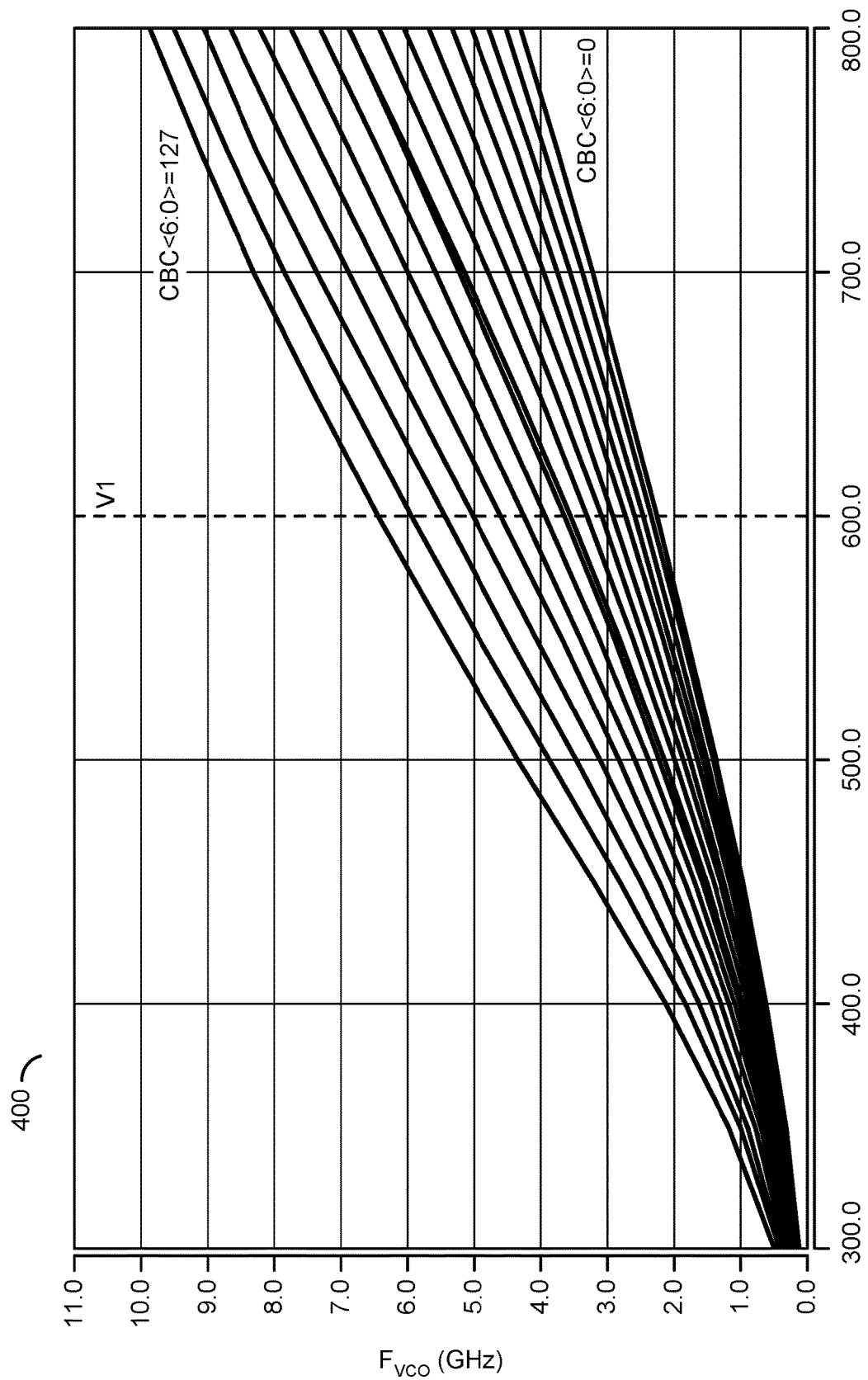
FIG. 9 is a diagram illustrating simulation results showing VCO frequency of a voltage-controlled oscillator in accordance with an embodiment of the invention at different control voltage levels and capacitor bank values.

Referring to FIG. 9, a diagram 400 is shown illustrating VCO frequency with a range of values of the control voltage VCTRL and a capacitor bank step size of eight for a voltage-controlled oscillator with OTA feedback in accordance with an embodiment of the invention. In an example, by changing the value of the signal CBC<6:0>, different overlapped tuning sub-bands may be selected for the range of frequency values controlled by the control voltage VCTRL. In an example, a calibration process (e.g., described in more detail below in connection with FIG. 14) may be performed to select the value of the signal CBC<6:0> that provides a desired frequency with a value of the control voltage VCTRL near half of the supply voltage (e.g., illustrated by the dashed line V1 in FIG. 9) when the PLL is locked. In an example, a VCO frequency of 5 GHz may be obtained with the signal CBC<6:0> set to a maximum value of 127. However, a tuning sub-band corresponding to a lower value of the signal CBC<6:0> provides the VCO frequency of 5 GHz with the value of the control voltage VCTRL near half of the supply voltage. The tuning sub-band corresponding to a lower value of the signal CBC<6:0> also generally provides a lower VCO tuning gain $K_{VCO}$, as illustrated in FIG. 10.

In an example, the calibration process may determine an optimum tuning sub-band under which the PLL 100 may acquire lock with the control voltage VCTRL at approximately half of the supply voltage VDD. During a calibration mode, the PLL 100 may be opened at the loop filter 56 and the control voltage VCTRL set to a reference voltage (e.g., approximately half of the supply voltage VDD). The calibration process may be performed by comparing the VCO frequency with a reference signal to determine which signal frequency is higher or lower. Depending on a result of the comparison, another tuning sub-band may be selected by changing the value of the signal CBC<6:0> and the calibration process repeated until predetermined calibration criteria are met. When the predetermined calibration criteria are met, the calibration process may save the value of the signal CBC<6:0> and the calibration mode may be terminated. In an example, a binary search technique may be used in the calibration process.

Figure 10:
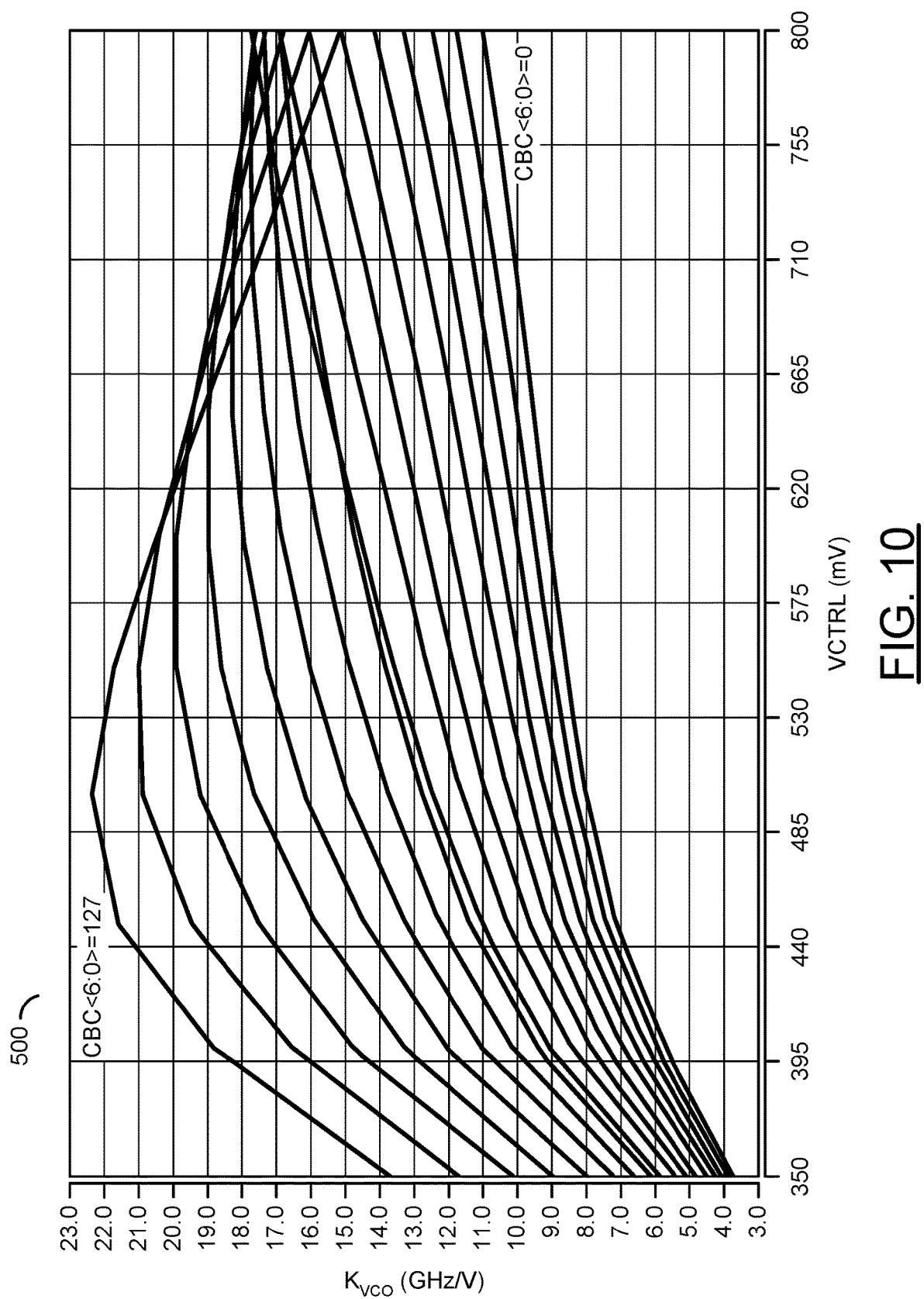
FIG. 10 is a diagram illustrating a simulation result showing VCO tuning gain ($K_{VCO}$) of a voltage-controlled oscillator in accordance with an embodiment of the invention at different control voltage levels and capacitor bank values.

Referring to FIG. 10, a diagram 500 is shown illustrating VCO tuning gain $K_{VCO}$ for a range of values of the control voltage VCTRL and a capacitor bank step size of eight for a voltage-controlled oscillator with OTA feedback in accordance with an embodiment of the invention. In an example, by calibrating the value of the signal CBC<6:0> to select a tuning sub-band that provides a desired frequency with the value of the control voltage VCTRL near half of the supply voltage when the PLL 100 is locked, the selected tuning sub-band may also provide a lower VCO tuning gain $K_{VCO}$ value, which may minimize reference spurs. As may be seen in FIG. 10, the tuning sub-band corresponding to a VCO frequency of 5 GHz with the value of the control voltage VCTRL near half of the supply voltage when the PLL 100 is locked also has a lower VCO tuning gain $K_{VCO}$ value than the VCO tuning gain $K_{VCO}$ value of the tuning sub-band obtained with the signal CBC<6:0> set to the maximum value of 127.

Figure 11:
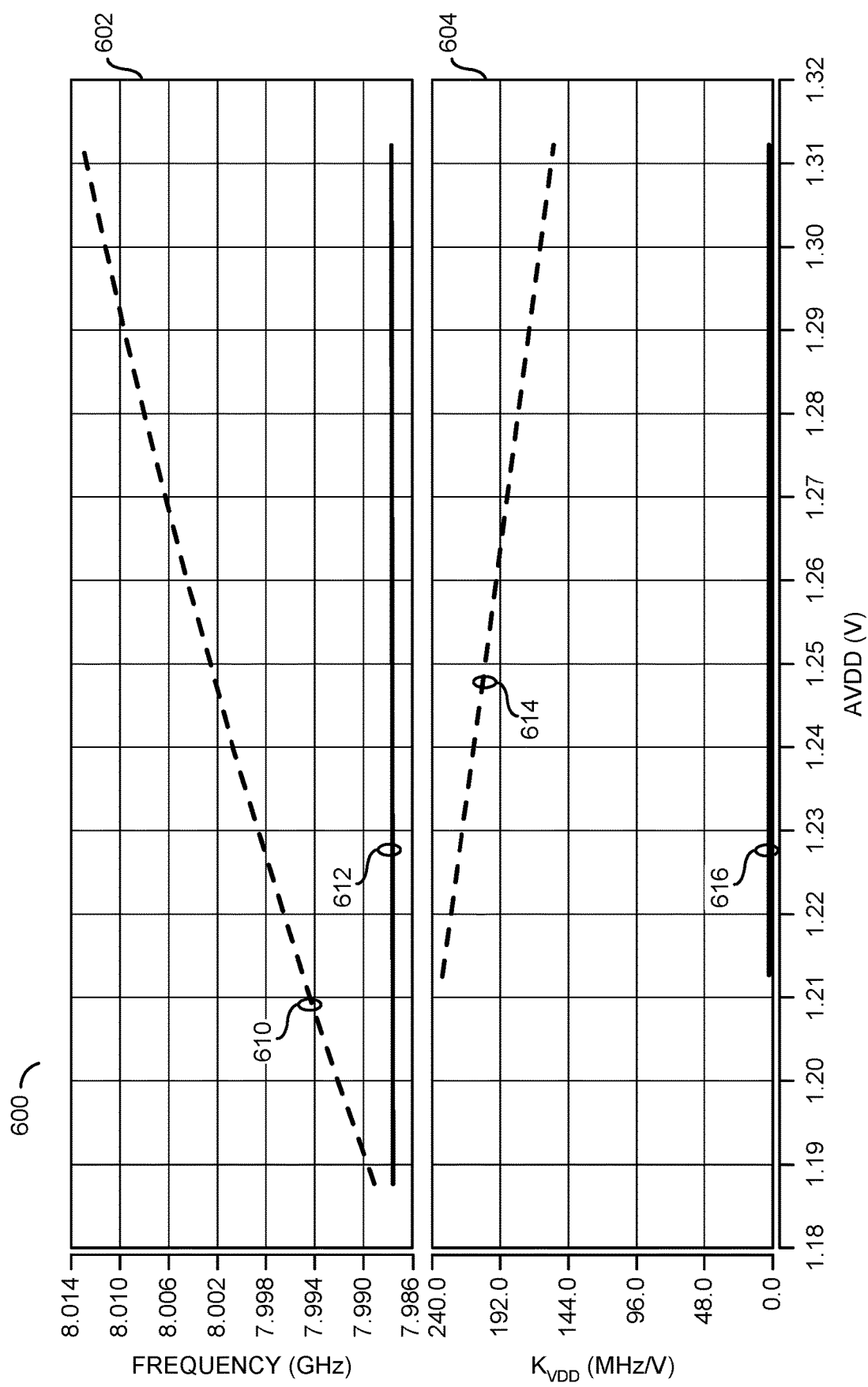
FIG. 11 is a diagram illustrating a comparison of simulations of supply noise rejection between a current-biased voltage-controlled oscillator without an LDO regulator and a voltage-controlled oscillator with OTA feedback in accordance with an embodiment of the invention.

Referring to FIG. 11, a diagram 600 is shown illustrating a simulation result of a supply noise rejection comparison between a current-biased voltage-controlled oscillator without a regulated supply and a voltage-controlled oscillator with OTA feedback in accordance with an embodiment of the invention. A graph 602 illustrates a comparison of VCO frequency versus supply voltage between a current-biased voltage-controlled oscillator and a voltage-controlled oscillator with OTA feedback in accordance with an embodiment of the invention. A graph 604 illustrates a comparison of a rate of change of VCO frequency versus supply voltage (e.g., $K_{VDD}$=deriv(VCO frequency)) between a current-biased voltage-controlled oscillator and a voltage-controlled oscillator with OTA feedback in accordance with an embodiment of the invention. A curve 610 illustrates the VCO frequency of a current-biased voltage-controlled oscillator over a range of VDD from 1.18V to 1.32V. A curve 612 illustrates the VCO frequency of a voltage-controlled oscillator with OTA feedback over the range of VDD from 1.18V to 1.32V. A curve 614 illustrates a rate of change in frequency due to supply noise of the current-biased voltage-controlled oscillator over the range of VDD from 1.18V to 1.32V. A curve 616 illustrates a rate of change in frequency due to supply noise of the voltage-controlled oscillator with OTA feedback in accordance with an embodiment of the invention over the range of VDD from 1.18V to 1.32V.

As may be seen in the graph 602, frequency variation due to supply noise in the voltage-controlled oscillator with OTA feedback is reduced from the frequency variation due to supply noise in the current-biased voltage-controlled oscillator. In an example, the frequency of the current-biased voltage-controlled oscillator varies 24.04 MHz due to supply voltage varying from 1.18V to 1.32V, while the frequency of the voltage-controlled oscillator with OTA feedback varies only 215.5 kHz due to the supply voltage varying from 1.18V to 1.32V. The rate of change in frequency due to supply noise of the voltage-controlled oscillator with OTA feedback is significantly lower than the rate of change in frequency due to supply noise of the current-biased voltage-controlled oscillator. In an example, the rate of change in frequency due to supply noise of the current-biased voltage-controlled oscillator is 232.4 MHz/V for supply voltage varying from about 1.18V to about 1.32V, while the rate of change in frequency due to supply noise of the voltage-controlled oscillator with OTA feedback is only 1.778 MHz/V for supply voltage varying from about 1.18V to about 1.32V.

Figure 12:
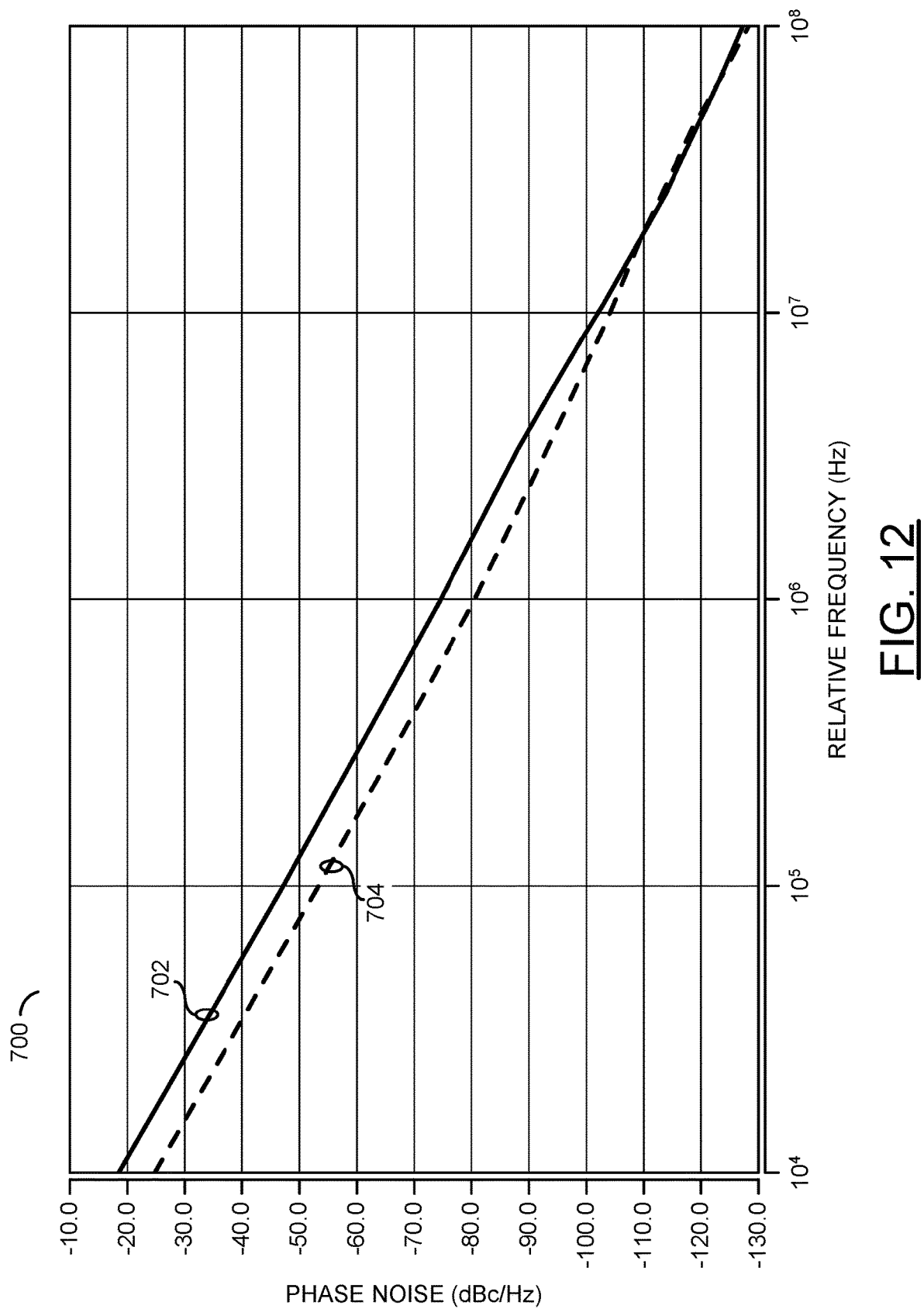
FIG. 12 is a diagram illustrating a comparison of phase noise simulations between a current-biased voltage-controlled oscillator without an LDO regulator and a voltage-controlled oscillator with OTA feedback in accordance with an embodiment of the invention.

Referring to FIG. 12, a diagram 700 is shown illustrating a comparison of simulations for phase noise from device flicker and thermal noise between a current-biased voltage-controlled oscillator and a voltage-controlled oscillator with OTA feedback in accordance with an embodiment of the invention. A curve 702 generally illustrates phase noise from device flicker and thermal noise for a voltage-controlled oscillator with OTA feedback in accordance with an embodiment of the invention. A curve 704 generally illustrates phase noise from device flicker and thermal noise for a current-biased voltage-controlled oscillator. The phase noise from device flicker and thermal noise for a voltage-controlled oscillator with OTA feedback in accordance with an embodiment of the invention may be higher than the current-biased voltage-controlled oscillator due to OTA device noise injection. However, as long as the VCO with OTA feedback meets jitter criteria of a particular application or the dominant source of jitter is from supply noise, there is no need to have a LDO regulator with the extra supply, resulting in a reduction in power consumption and cost.

Figure 13:
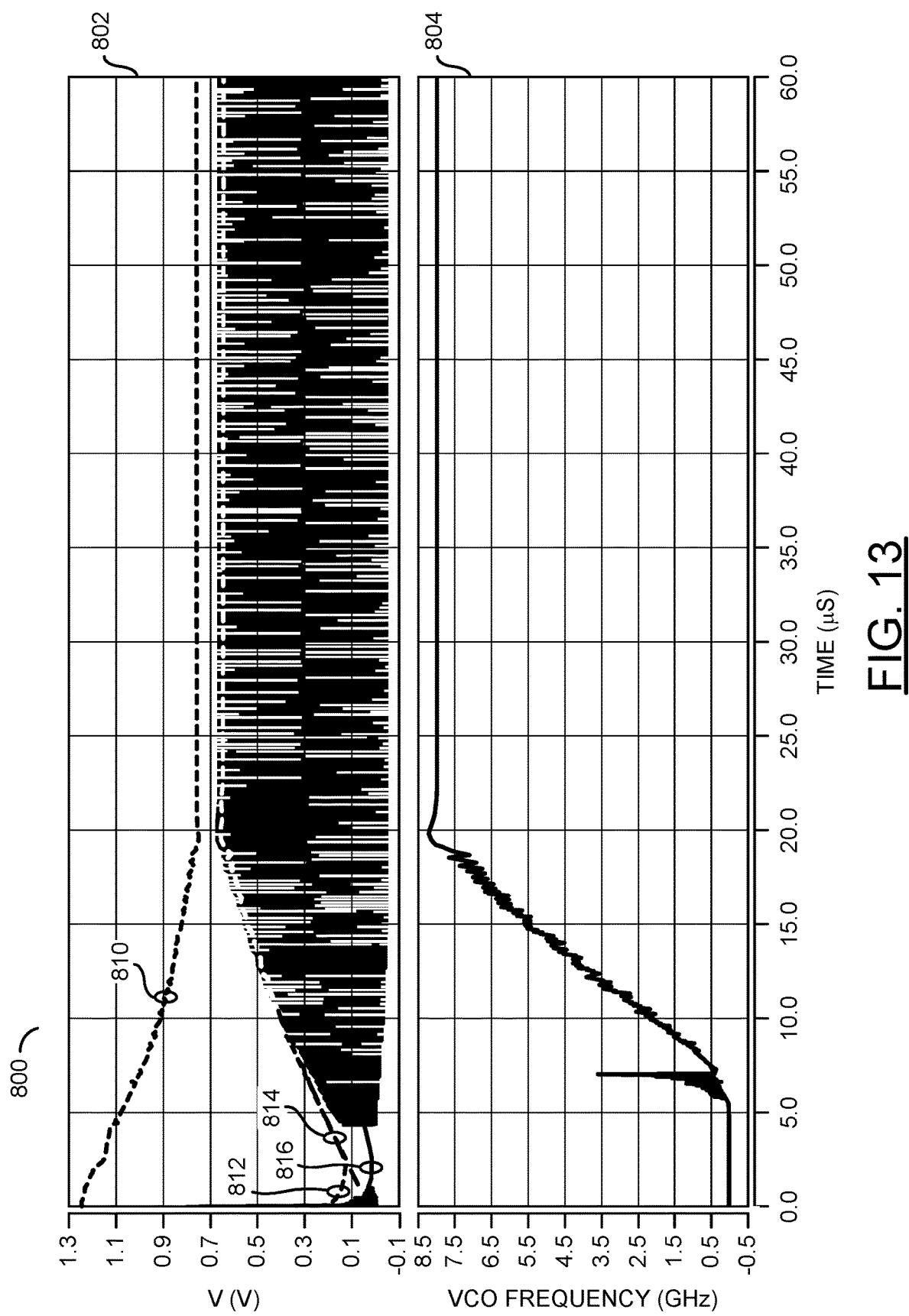
FIG. 13 is a diagram illustrating a simulation result of a phase-locked loop utilizing a voltage-controlled oscillator with OTA feedback in accordance with an embodiment of the invention.

Referring to FIG. 13, a diagram 800 is shown illustrating simulation results of a PLL implementing a voltage-controlled oscillator with OTA feedback in accordance with an embodiment of the invention. A graph 802 illustrates voltage levels of the signals VCTRL, VFB, and OUT during a startup period. A graph 804 illustrates variation in the frequency Fvco of the output signal OUT during the startup period. A curve 810 illustrates a voltage level of the signal GREF. A curve 812 illustrates the voltage level VFB of the control current signal ICTRL. A curve 814 illustrates a voltage level of the signal VCTRL. A curve 816 illustrates a voltage level of the signal OUT. The OTA 130 initially operates open loop to pull down the signal GREF to provide a large amount of current to start the VCO 100 oscillating. The OTA 130 then switches to closed loop operation and the voltage level of the control current signal ICTRL and the VCO output swing begin tracking the voltage level of the signal VCTRL and the frequency Fvco of the output signal OUT stabilizes to a predetermined value.

Figure 14:
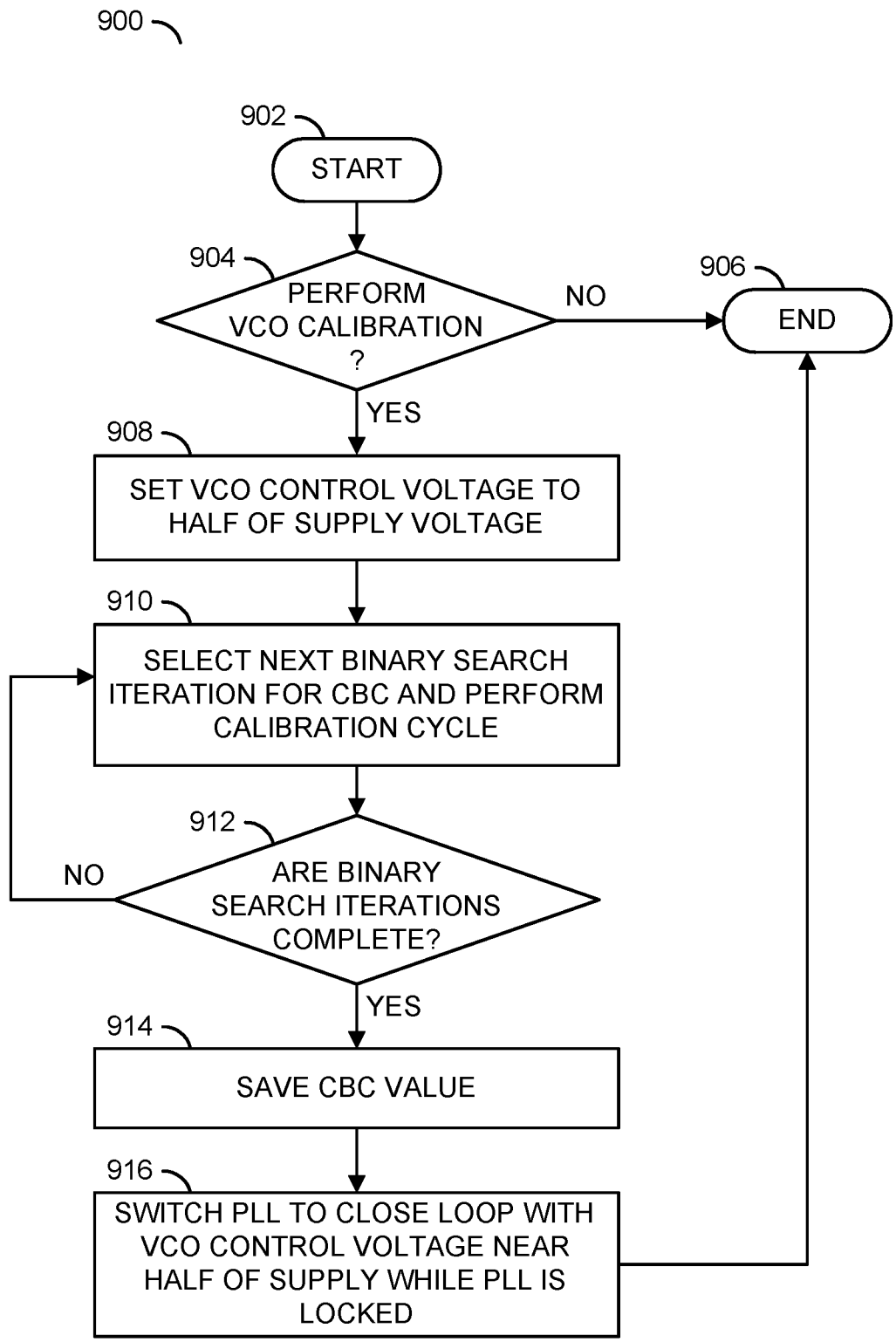
FIG. 14 is a diagram illustrating a calibration process in accordance with an embodiment of the invention.

Referring to FIG. 14, a diagram is shown illustrating a calibration process in accordance with an embodiment of the invention. In an example, a method (or process) 900 may implement a calibration process in accordance with an embodiment of the invention. In an example, the method 900 may comprise a step (or state) 902, a decision step (or state) 904, a step (or state) 906, a step (or state) 908, a step (or state) 910, a step (or state) 912, a decision step (or state) 914, and a step (or state) 916. The method 900 may begin in the step 902 and move to the decision step 904. In the decision step 904, the method 900 may determine whether VCO calibration is to be performed. When VCO calibration is not to be performed, the method 900 may move to the step 906 and terminate. When VCO calibration is to be performed, the method 900 may move to the step 908.

In the step 908, the method 900 may begin the calibration process by breaking (interrupting) the closed loop operation of the PLL 100. In an example, the method 900 may break the closed loop operation by disabling the charge pump circuit 104 and presenting a reference voltage (e.g., VREF) as the signal VCTRL at the control input of the VCO 100. In an example, the reference voltage VREF may be set having a voltage level that is half of the supply voltage AVDD of the VCO 100. The method 900 may then move to the step 910.

In the step 910, the method 900 may select a next value for the signal CBC. In an example, the method 900 may utilize a binary search strategy. After setting the signal CBC to the next value, the method 900 may perform a calibration cycle iteration, and then move to the step 912. In the step 912, the method 900 may determine whether the number of iterations of the binary search strategy are completed. When the number of iterations of the binary search strategy are not completed, the method 900 may return to the step 910. When the number of iterations of the binary search strategy are completed, the method 900 may move to the step 914.

In the step 914, the method 900 may save the value of the signal CBC. In an example, the value of the signal CBC may be saved in a latch, in a register, or in a location in a configuration memory. The method 900 may then move to the step 914. In the step 914, the method 900 may switch the PLL 100 back to closed loop operation with the VCO control voltage VCTRL near half of the supply voltage AVDD while the PLL is locked. The method 900 may then move to the step 916 and terminate.

In an example, the calibration process 900 may determine an optimum tuning sub-band under which the PLL 100 may acquire lock with the control voltage VCTRL at approximately half of the supply voltage VDD. The calibration process 900 may open the PLL 100 at the loop filter 56 and set the control voltage VCTRL to a reference voltage (e.g., approximately half of the supply voltage VDD). In a calibration cycle iteration, the calibration process 900 may compare the VCO frequency with a reference signal to determine which signal frequency is higher or lower. Depending on a result of the comparison, another tuning sub-band may be selected by the calibration process 900 changing the value of the signal CBC<6:0> and repeating the calibration cycle iterations until the predetermined calibration criteria are met. When the predetermined calibration criteria are met, the calibration process 900 may save the value of the signal CBC<6:0> and the calibration mode may be terminated.

The functions performed by the diagrams of FIGS. 1-14 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals of the present invention are generally "asserted" (e.g., a digital HIGH, or 1) or "un-asserted" (e.g., a digital LOW, or 0). However, the particular polarities of the asserted (e.g., on) and un-asserted (e.g., off) states of the signals may be adjusted (e.g., reversed) to meet the design criteria of a particular implementation. Additionally, inverters may be added to change a particular polarity of the signals.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
    a first circuit comprising an operational transconductance amplifier and a first transistor configured to generate a control current signal in response to a supply voltage and a first input signal, wherein said first input signal comprises a control voltage signal and said first circuit provides supply noise rejection to variations in said supply voltage; and
    a second circuit connected to said first circuit and comprising a programmable ring oscillator configured to generate an output signal in response to the control current signal and a second input signal, wherein a frequency of the output signal is based on a voltage level of the control voltage signal and a value of the second input signal.

2. The apparatus according to claim 1, wherein said first circuit and said second circuit are configured as a voltage-controlled oscillator configured to generate said output signal.

3. The apparatus according to claim 2, wherein said first circuit and said second circuit are implemented as components of a phase-locked loop.

4. The apparatus according to claim 1, wherein said control voltage signal is presented to a first input terminal of said operational transconductance amplifier, an output terminal of said operational transconductance amplifier is connected to a gate terminal of said first transistor, a source terminal of said first transistor is connected to said supply voltage, and a drain terminal of said first transistor is connected to a second input terminal of said operational transconductance amplifier and configured to present said control current signal in response to said voltage level of said control voltage signal and said supply voltage.

5. The apparatus according to claim 4, further comprising a resistive-capacitive network connected between said output terminal of said operational transconductance amplifier and said supply voltage.

6. The apparatus according to claim 5, wherein said first circuit further comprises a second transistor connected between said output terminal of said operational transconductance amplifier and said supply voltage, and configured to implement a power down feature.

7. The apparatus according to claim 6, wherein said first transistor and said second transistor comprise one or more p-channel metal-oxide-semiconductor field effect transistors.

8. The apparatus according to claim 1, wherein:
said programmable ring oscillator comprises 2n+1 inverter circuits and 2n+1 switched-capacitor banks, where n is a positive integer; and
each of said 2n+1 switched-capacitor banks are controlled in response to said second input signal.

9. The apparatus according to claim 8, wherein each of said switched-capacitor banks is programmed in response to said value of said second input signal.

10. The apparatus according to claim 9, wherein said second input signal comprises a plurality of binary bits.

11. The apparatus according to claim 10, wherein each of said switched-capacitor banks comprises a plurality of binary-weighted stages controlled in response to said value of said second input signal.

12. The apparatus according to claim 11, wherein said apparatus implements a calibration mode in which said value of said second input signal is determined based on criteria comprising frequency and control voltage.

13. The apparatus according to claim 12, wherein said calibration mode selects said value of said second input signal that provides a particular frequency when said voltage level of said control voltage signal is about half of said supply voltage.

14. A method of providing supply noise rejection in a voltage-controlled oscillator circuit comprising:
generating a control current signal in response to a supply voltage and a first input signal, wherein said first input signal comprises a control voltage signal, said control current signal is generated by a voltage controlled current source comprising an operational transconductance amplifier and a transistor, and said voltage controlled current source provides supply noise rejection to variations in said supply voltage; and
generating an output signal in response to the control current signal and a second input signal using a programmable ring oscillator circuit, wherein (i) a frequency of the output signal is based on a voltage level of the control voltage signal and a value of the second input signal, and (ii) a frequency range of said programmable ring oscillator circuit is set based on the value of the second input signal.

15. The method according to claim 14, wherein said control current signal is maintained at a constant level through operational transconductance amplifier feedback.

16. The method according to claim 14, wherein said voltage-controlled oscillator circuit generates said output signal in response to the voltage level of said control voltage signal and said value of said second input signal.

17. The method according to claim 16, wherein:
said programmable ring oscillator circuit comprises 2n+1 inverter circuits connected to 2n+1 switched-capacitor banks, where n is a positive integer; and
said method further comprises selecting a capacitance of each of said 2n+1 switched-capacitor banks by setting said value of said second input signal.

18. The method according to claim 17, wherein said value of said second input signal determines a number of binary-weighted stages of each of said 2n+1 switched-capacitor banks that are enabled.

19. The method according to claim 17, wherein setting said value of said second input signal comprises performing a calibration process on said voltage-controlled oscillator circuit.

20. The method according to claim 19, wherein performing said calibration process on said voltage-controlled oscillator circuit determines said value of said second input signal that selects a tuning sub-band that provides a predetermined frequency of said voltage-controlled oscillator circuit when the voltage level of the control voltage signal is about half of the supply voltage.

* * * * *